United States Patent
Kim et al.

(10) Patent No.: US 11,373,716 B2
(45) Date of Patent: Jun. 28, 2022

(54) NON-VOLATILE MEMORY DEVICES AND PROGRAM METHODS THEREOF

(71) Applicant: Samsung Electronics Co., Ltd., Suwon-si (KR)

(72) Inventors: Wandong Kim, Incheon (KR); Jinwoo Park, Hwaseong-si (KR); Seongjin Kim, Gimpo-si (KR); Sang-wan Nam, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/804,470

(22) Filed: Feb. 28, 2020

(65) Prior Publication Data
US 2021/0020254 A1  Jan. 21, 2021

(30) Foreign Application Priority Data
Jul. 18, 2019  (KR) ........................ 10-2019-0086948

(51) Int. Cl.
*G11C 16/06* (2006.01)
*G11C 16/34* (2006.01)
(Continued)

(52) U.S. Cl.
CPC ........ *G11C 16/3454* (2013.01); *G11C 7/1057* (2013.01); *G11C 7/1084* (2013.01);
(Continued)

(58) Field of Classification Search
CPC ............ G11C 16/3454; G11C 16/3459; G11C 16/0483; G11C 16/08; G11C 16/24;
(Continued)

(56) References Cited

U.S. PATENT DOCUMENTS 7,679,133 B2  3/2010  Son et al.
7,916,533 B2  3/2011  Dong et al.
(Continued)

FOREIGN PATENT DOCUMENTS

KR  10-2018-0135905  * 11/2018  ............. G11C 16/04

OTHER PUBLICATIONS

Office action dated Jul. 9, 2021, for corresponding U.S. Appl. No. 16/991,443.
(Continued)

*Primary Examiner* — Uyen Smet
(74) *Attorney, Agent, or Firm* — Harness, Dickey & Pierce, P.L.C.

(57) ABSTRACT

A program method of a non-volatile memory device, the non-volatile memory device including a cell string having memory cells stacked perpendicular to a surface of a substrate, the method includes performing a first program phase including programming a first memory cell connected to a first word line and applying a first pass voltage to other word lines above or below the first word line, and performing a second program phase including programming a second memory cell after the first memory cell is completely programmed, the second memory cell being connected to a second word line closer to the substrate than the first word line, applying a second pass voltage to a first word line group below the second word line and applying a third pass voltage to a second word line group above the second word line, the second pass voltage being lower than the third pass voltage.

11 Claims, 22 Drawing Sheets

(51) Int. Cl.
*G11C 16/08* (2006.01)
*G11C 16/26* (2006.01)
*G11C 16/12* (2006.01)
*G11C 7/10* (2006.01)
*G11C 16/24* (2006.01)

(52) U.S. Cl.
CPC .............. *G11C 16/08* (2013.01); *G11C 16/12* (2013.01); *G11C 16/24* (2013.01); *G11C 16/26* (2013.01); *G11C 2207/2245* (2013.01)

(58) Field of Classification Search
CPC ................ G11C 11/5628; G11C 16/10; G11C 2211/5621; G11C 7/1057; G11C 7/1084
See application file for complete search history.

(56) References Cited

U.S. PATENT DOCUMENTS

| | | | |
|---|---|---|---|
| 8,045,387 B2 | 10/2011 | Park et al. | |
| 8,553,466 B2 | 10/2013 | Han et al. | |
| 8,559,235 B2 | 10/2013 | Yoon et al. | |
| 8,644,074 B2 | 2/2014 | Chang et al. | |
| 8,654,587 B2 | 2/2014 | Yoon et al. | |
| 9,659,660 B2 | 5/2017 | Nam et al. | |
| 10,121,529 B2 | 11/2018 | Lee | |
| 10,269,570 B2 | 4/2019 | Lee | |
| 2004/0178819 A1 | 9/2004 | New | |
| 2011/0220987 A1 | 9/2011 | Tanaka et al. | |
| 2011/0233648 A1 | 9/2011 | Seol et al. | |
| 2011/0286274 A1* | 11/2011 | Chang | G11C 16/0483 365/185.17 |
| 2012/0003800 A1 | 1/2012 | Lee et al. | |
| 2018/0233207 A1 | 8/2018 | Seo | |
| 2018/0374541 A1 | 12/2018 | Jung et al. | |
| 2019/0146685 A1* | 5/2019 | Maejima | G11C 11/5635 711/103 |
| 2020/0143890 A1 | 5/2020 | Lee | |
| 2020/0388312 A1* | 12/2020 | Park | G11C 8/08 |

OTHER PUBLICATIONS

Office action dated Dec. 8, 2021, for corresponding U.S. Appl. No. 16/991,443.

Notice of Allowance dated Feb. 25, 2022 for corresponding U.S. Appl. No. 16/991,443.

* cited by examiner

NON-VOLATILE MEMORY DEVICES AND PROGRAM METHODS THEREOF

CROSS-REFERENCE TO RELATED APPLICATIONS

This application claims priority under 35 U.S.C. § 119 to Korean Patent Application No. 10-2019-0086948 filed on Jul. 18, 2019, in the Korean Intellectual Property Office, the disclosures of which are incorporated by reference herein in their entireties.

BACKGROUND

Some example embodiments disclosed herein relate to semiconductor memory devices, and more particularly, relate to non-volatile memory devices and program methods thereof.

Semiconductor memory devices are classified as volatile semiconductor memory devices and non-volatile semiconductor memory devices. Volatile semiconductor memory devices have fast read and write speeds but lose data stored therein when power is disconnected therefrom. In contrast, non-volatile semiconductor memory devices retain data stored therein even when power is disconnected therefrom. For this reason, non-volatile semiconductor memory devices are used to store information that it is desirable to retain regardless of whether a power is supplied thereto.

A flash memory device may be an example of a non-volatile semiconductor memory device. Flash memory devices are used for storing voice and image data of information devices. Examples of such information devices include one or more of a computer, a cellular phone, a smartphone, a personal digital assistant (PDA), a handheld personal computer (PC), a game console, a facsimile, a scanner, and a printer. Semiconductor memory devices with three-dimensionally stacked memory cells are being developed to improve the degree of integration of the semiconductor memory devices.

A three-dimensional semiconductor memory device may include a cell string that is implemented by stacking memory cells in a direction perpendicular to a substrate to improve the degree of integration. However, there is a demand for maintaining the reliability of the three-dimensional semiconductor memory device together with improving the degree of integration. In particular, channel holes of cell strings of the three-dimensional semiconductor memory device are different in size depending on locations thereof due to an etching process. It would be desirable to develop a method of programming memory cells in consideration of this geometrical characteristic in the three-dimensional semiconductor memory device.

SUMMARY

Some example embodiments provide a non-volatile memory device performing a program operation in consideration of a geometrical structure of a cell string and a program method thereof.

According to some example embodiments, a program method of a non-volatile memory device, the non-volatile memory device including a cell string in which a plurality of memory cells are stacked in a direction perpendicular to a surface of a substrate, the method includes performing a first program phase including programming a first memory cell among the plurality of memory cells, the first memory cell being connected to a first word line among a plurality of word lines of the cell string, the first program phase including applying a first pass voltage to other word lines among the plurality of word lines above or below the first word line, and performing a second program phase including programming a second memory cell among the plurality of memory cells after the first memory cell is completely programmed, the second memory cell being connected to a second word line among the plurality of word lines closer to the substrate than the first word line, the second program phase including applying a second pass voltage to a first word line group among the plurality of word lines below the second word line and applying a third pass voltage to a second word line group among the plurality of word lines above the second word line, the second pass voltage being lower than the third pass voltage.

According to some example embodiments, a program method of a non-volatile memory device, the non-volatile memory device including a cell string in which a plurality of memory cells are stacked in a direction perpendicular to a surface of a substrate, the method includes performing a program verify phase including applying a verify voltage to a selected word line among a plurality of word lines of the cell string and applying a read pass voltage to a plurality of unselected word lines among the plurality of word lines to verify whether a selected memory cell among the plurality of memory cells is programmed, the selected word line being programmed before a first word line among the plurality of word lines closer to the substrate or after a second word line among the plurality of word lines more distant from the substrate, performing a first recovery phase including applying a first recovery voltage to the selected word line and the plurality of unselected word lines and applying a precharge voltage to a common source line of the cell string, and performing a second recovery phase including discharging at least one of the plurality of unselected word lines to a ground voltage.

According to some example embodiments, a non-volatile memory device including a memory cell array including a cell string in which a plurality of memory cells are stacked in a direction perpendicular to a surface of a substrate, an address decoder configured to select a word line among a plurality of word lines included in the cell string for programming the plurality of memory cells, a page buffer configured to control a bit line of the cell string, and a control logic circuit configured to control the address decoder and the page buffer such that a word line among the plurality of word lines furthest from the substrate is first programmed in a program operation, and perform a recovery phase after a program verify operation, the recovery phase including applying a recovery voltage to a selected word line among the plurality of word lines and unselected word lines among the plurality of word lines, and the recovery phase including applying a precharge voltage to a common source line of the cell string.

BRIEF DESCRIPTION OF THE FIGURES

The above and other objects and features will become apparent by describing in some example embodiments with reference to the accompanying drawings.

DETAILED DESCRIPTION

Figure 1:
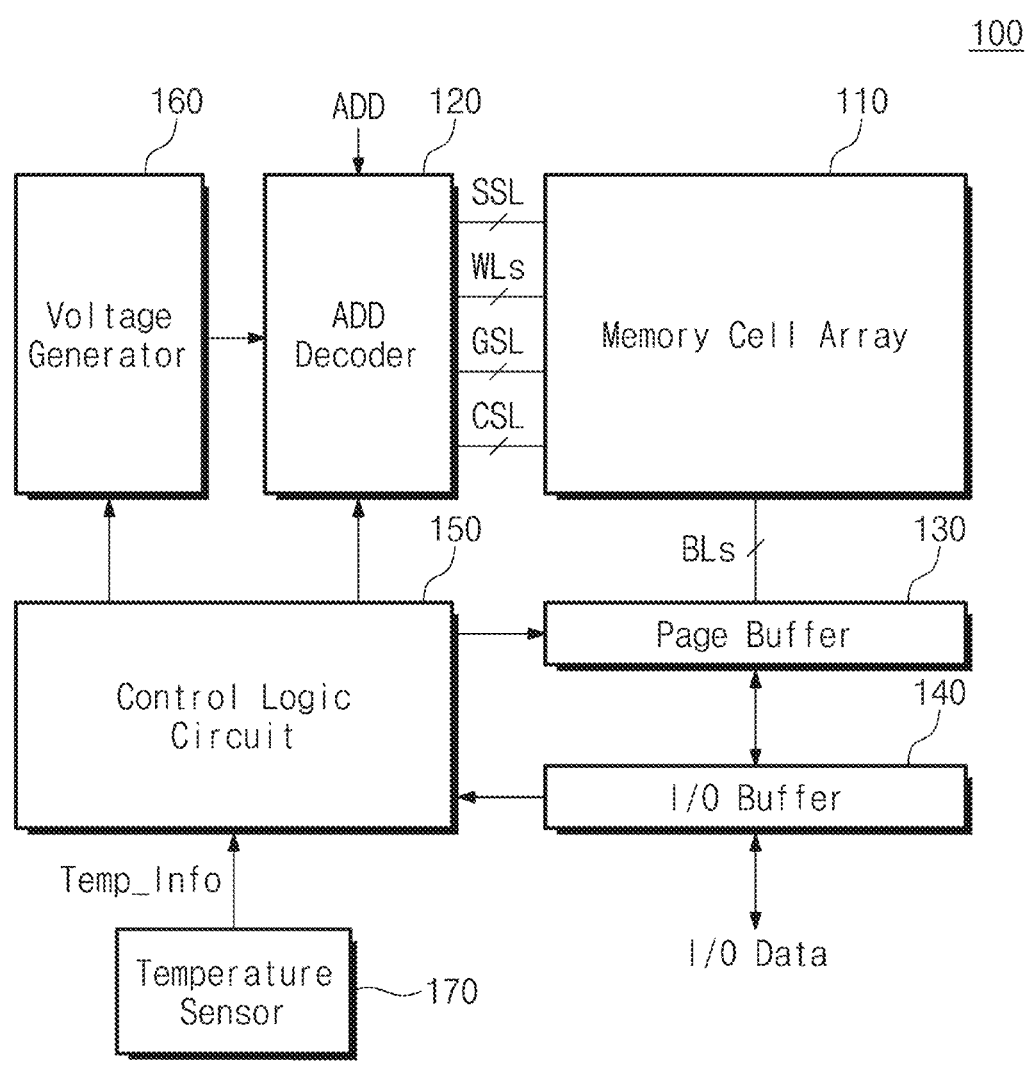
FIG. 1 is a block diagram illustrating a non-volatile memory device according to some example embodiments.

It should be understood that both the foregoing general description and the following detailed description are provided as examples, and it should be regarded as an additional description is provided. Reference numerals will be represented in detail in some example embodiments, examples of which are illustrated in the accompanying drawings. Wherever possible, the same reference numerals are used in the drawings and the description to refer to the same or similar parts.

Below, for convenience of description, the names of word lines may be defined depending on locations. In a memory block or a cell string, a word line selected for a program operation is referred to as a "selected word line". The remaining word lines of the word lines other than the selected word line are referred to as "unselected word lines". Also, among the unselected word lines, all or a part of unselected word lines located above the selected word line with respect to a substrate are referred to as a "first word line group". Among the unselected word lines, unselected word lines located below the selected word line from the substrate are referred to as a "second word line group".

FIG. 1 is a block diagram illustrating a non-volatile memory device according to some example embodiments.

Referring to FIG. 1, a non-volatile memory device 100 may include a memory cell array 110, an address decoder 120, a page buffer 130, an input/output (I/O) buffer 140, a control logic circuit 150, a voltage generator 160, and/or a temperature sensor 170. According to some example embodiments, operations described herein as being performed by the non-volatile memory device 100, the address decoder 120, the page buffer 130 (e.g., operation as a write driver and/or a sense amplifier), the control logic circuit 150, the voltage generator 160, and/or the temperature sensor 170 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 110 may be connected to the address decoder 120 through word lines WL, selection lines SSL and GSL, and/or a common source line CSL. The memory cell array 110 may be connected to the page buffer 130 through bit lines BL. The memory cell array 110 may include a plurality of NAND cell strings. Channels of the NAND cell strings may be formed in a vertical direction. The word lines of the memory cell array 110 may be stacked in a direction that is perpendicular to the substrate.

In a program operation, a characteristic difference may occur between memory cells corresponding to stacked word line layers. To stack memory cells in a vertical structure, channels may be formed vertically penetrating the word lines by using an etching process. For example, in the case where an aspect ratio of a pillar is not great, when the etching process is performed to form the channels, a diameter of each channel hole may decrease as a depth of each channel hole increases. That is, as the etching process is performed, sizes of memory cells may vary for respective layers. This may mean that a size of a tunneling insulating layer or a floating gate of each memory cell varies depending on a channel depth.

Even though the same program voltage or a similar program voltage may be applied to memory cells under the above-described condition, electric fields of different magnitudes may be applied across floating gates of memory cells having different sizes. Under the same program voltage condition or a similar program voltage condition, a relatively great electric field may be formed at a floating gate of a memory cell having a relatively small size. Accordingly, a program speed of a memory cell having a relatively small diameter may be relatively fast.

According to some example embodiments, to solve an issue caused by this geometrical characteristic of the cell string, memory cells that are distant from the substrate may be the first programmed. However, in the case where memory cells are programmed in this program order, a channel of a cell string may be separated and boosted when programming memory cells close to the substrate. A potential difference of boosted channels may occur, thus causing hot electron injection. However, some example embodiments may provide a word line voltage applying method for preventing this hot electron injection (HCI) issue occurring in the program operation or reducing the occurrence of the HCI issue.

The address decoder 120 may select one of a plurality of memory blocks of the memory cell array 110 in response to an address ADD. The address decoder 120 may select one of a plurality of word lines of the selected memory block. The address decoder 120 may provide a word line voltage from the voltage generator 160 to the selected word line of the selected memory block. In the program operation, the address decoder 120 may provide a program/verify voltage Vpgm/Vfy to a selected word line and a pass voltage Vpass to an unselected word line(s). When a location of the selection word line is closer to the substrate than a reference location, the address decoder 120 may change a level of the pass voltage Vpass. For example, the address decoder 120 may increase a level of the pass voltage Vpass to be provided to some word lines (e.g., the first word line group) located above the selected word line and may decrease a level of the pass voltage Vpass to be provided to some word lines (e.g., the second word line group) located below the selected word line.

The address decoder 120 may select word lines such that memory cells close to the string selection line SSL are first programmed in the program operation. To satisfy this program order, a location where the program operation starts is not limited to a location of any one of memory cells in a cell string (or the program operation may start regardless of a location of a memory cell). In particular, in the case where a memory cell adjacent to the string selection line SSL is first programmed, it may be impossible or difficult to initialize a channel by using the string selection line SSL and a bit line. Accordingly, the address decoder 120 may perform various channel initialization operations based on the above-described program order. For example, the address decoder 120 may determine a time to apply voltages to a string selection line, a ground selection line, and/or a common source line for performing the channel initialization operation corresponding to a program order of memory cells.

The page buffer 130 may operate as a write driver and/or a sense amplifier depending on a mode of operation. In the program operation, the page buffer 130 may supply a bit line of the memory cell array 110 to a bit line voltage corresponding to data "DATA" to be programmed. In a read operation, the page buffer 130 may sense data stored in a selected memory cell through a bit line. The page buffer 130 may latch and output the sensed data "DATA". The page buffer 130 may include a plurality of page buffers that are respectively connected to bit lines. According to some example embodiments, the input/output (I/O) buffer 140 may buffer data received from, and/or for transmission, outside the non-volatile memory device 100 (e.g., from and/or to a host device), such as when performing a program and/or read operation.

The control logic circuit 150 may control the address decoder 120, the page buffer 130, and/or the voltage generator 160 in response to a command CMD and/or an address ADD from the outside (e.g., from a host device). The control logic circuit 150 may control the address decoder 120, the page buffer 130, and/or the voltage generator 160 such that memory cells distant from the substrate are first programmed in the program operation.

The control logic circuit 150 may control the address decoder 120, the page buffer 130, and/or the voltage generator 160 to perform a recovery operation and a program execution operation after a program verify operation. The recovery operation (or a recovery phase) of some example embodiments includes a first recovery operation RCV1 (or a first recovery phase) and a second recovery operation RCV2 (or a second recovery phase). In the first recovery operation RCV1, a recovery voltage Vrcv may be applied to all word lines. In the second recovery operation RCV2 following the first recovery operation RCV1, the recovery voltage Vrcv may be provided to a selected word line and some word lines (e.g., the first word line group and the second word line group) adjacent to the selected word line, and the remaining word lines may be discharged to a ground level. This will be described in detail with reference to drawings to be described below. The control logic circuit 150 may control the address decoder 120, the page buffer 130, and/or the voltage generator 160 to perform this recovery operation.

The control logic circuit 150 may control the address decoder 120, the page buffer 130, and/or the voltage generator 160 such that a pass voltage according to some example embodiments is applied to word lines in the program execution operation. The control logic circuit 150 may decrease a level of the pass voltage to be provided to some word lines (e.g., the first word line group) located below the selected word line and may increase a level of the pass voltage to be provided to some word lines (e.g., the second word line group) located above the selected word line.

In particular, the control logic circuit 150 may allow the address decoder 120 to adjust (or regulate) a level of the pass voltage Vpass to be provided in the program operation with reference to temperature information Temp_Info provided from the temperature sensor 170. An operation of the address decoder 120 may be performed such that there is increased a level of the pass voltage Vpass to be provided to some word lines located above a selected word line having a specific location (or height) and there is decreased a level of the pass voltage Vpass to be provided to some word lines located below the selected word line. However, at a specific driving temperature or lower, the control logic circuit 150 allows the address decoder 120 to additionally increase the level of the pass voltage Vpass to be provided to some word lines located above the selected word line. At the specific driving temperature or lower, the control logic circuit 150 allows the address decoder 120 to additionally decrease the level of the pass voltage Vpass to be provided to some word lines located below the selected word line. According to some example embodiments, the specific driving temperature may be a design parameter determined through empirical study Under control of the control logic circuit 150, the voltage generator 160 may generate various kinds of word line voltages to be supplied to the word lines and/or a voltage to be supplied to a bulk (e.g., a well area) in which the memory cells are formed. The word line voltages to be supplied to the word lines may include the program voltage Vpgm, the pass voltage Vpass, selection and non-selection read voltages VRD and Vread, etc. The voltage generator 160 may generate selection line voltages VSSL and VGSL to be provided to the selection lines SSL and GSL in the read operation and the program operation.

The temperature sensor 170 may provide the sensed temperature information Temp_Info of the non-volatile memory device 100 to the control logic circuit 150. The temperature sensor 170 may measure an internal temperature of the non-volatile memory device 100 and may generate the temperature information Temp_Info obtained by converting the measured temperature into numerical information. For example, a thermo electromotive force (or thermoelectric couple) sensor that uses an electromotive force varying depending on a temperature, a pyro conductivity sensor that senses a resistance value varying depending on a temperature, etc. may be used as the temperature sensor 170. However, a temperature measuring manner of the temperature sensor 170 is not limited thereto. For example, it may be well understood that various manners may be applied to the temperature sensor 170.

The non-volatile memory device 100 of some example embodiments includes a memory block in which a cell string is formed in a direction perpendicular to the substrate. The non-volatile memory device 100 may first program memory cells distant from the substrate. In addition, in this program sequence, when memory cells located below a specific word line (or a reference word line) are programmed, a pass voltage to be provided to at least one unselected word line located above the selected word line may be controlled to increase. When the memory cells located below the specific word line are programmed, a pass voltage to be provided to at least one unselected word line located below the selected word line may be controlled to decrease.

Figure 2:
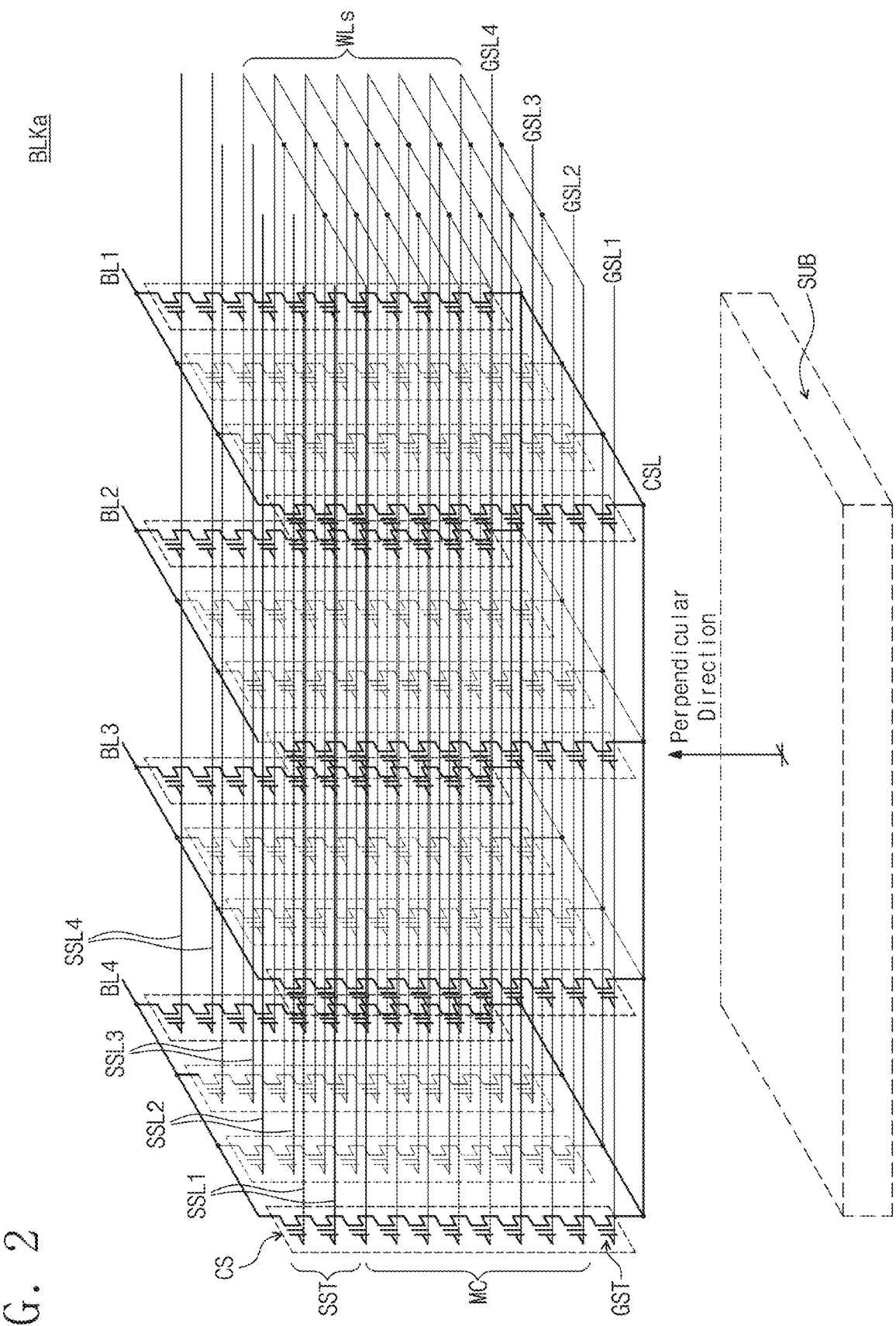
FIG. 2 is a diagram illustrating a memory block according to some example embodiments.

FIG. 2 is a diagram illustrating a memory block BLKa according to some example embodiments. According to some example embodiments, the memory block BLKa may be the same as or similar to the memory cell array 110. Referring to FIG. 2, a plurality of cell strings CS may be arranged on a substrate SUB in rows and columns. The cell strings CS may be connected in common to the common source line CSL that is formed on (or in) the substrate SUB. In FIG. 2, an example location of the substrate SUB is depicted as an aid for understanding a structure of the memory block BLKa. An example is illustrated in FIG. 2 as the common source line CSL is connected to lower ends of the cell strings CS. However, the common source line CSL may be electrically connected to the lower ends of the cell strings CS, and some example embodiments are not limited to the case that the common source line CSL is physically located at the lower ends of the cell strings CS. In some example embodiments, the cell strings CS of a 4×4 matrix are shown in FIG. 2. However, some example embodiments are not limited thereto.

Cell strings CS of each row may be connected to the corresponding one of first to fourth ground selection lines GSL1 to GSL4 (e.g., the first ground selection line GSL1, the second ground selection line GSL2, the third ground selection line GSL3, and the fourth ground selection line GSL4) or the corresponding one of first to fourth string selection lines SSL1 to SSL4 (e.g., the first string selection line SSL1, the second string selection line SSL2, the third string selection line SSL3, and the fourth string selection line SSL4). However, the first to fourth ground selection lines GSL1 to GSL4 may be connected in common to each other. Cell strings CS of each column may be connected to the corresponding one of first to fourth bit lines BL1 to BL4 (e.g., the first bit line BL1, the second bit line BL2, the third bit line BL3, and the fourth bit line BL4). For ease of illustration, cell strings CS that are connected to the second and third ground selection lines GSL2 and GSL3 or the second and third string selection lines SSL2 and SSL3 are depicted to be blurred.

Each cell string CS may include at least one ground selection transistor GST connected to the corresponding ground selection line, a plurality of memory cells MC respectively connected to a plurality of word lines WL, and at least one (or two) string selection transistors SST connected to the corresponding string selection line. In each cell string CS, the ground selection transistor GST, the memory cells MC, and the string selection transistor SST may be serially connected to each other in a direction that is perpendicular to the substrate SUB and may be sequentially stacked in the direction that is perpendicular to the substrate SUB. Also, the memory cells MC may include a dummy memory cell that is not used to store data. The dummy memory cell may be used for various purposes.

Memory cells of the cell strings CS, which are located at the same height or a similar height from the substrate SUB or the ground selection transistor GST, may be connected to the same word line or a similar word line. Memory cells of the cell strings CS, which are located at different heights from the substrate SUB or the ground selection transistor GST, may be connected to different word lines.

The memory block BLKa may be implemented with a three-dimensional (3D) memory array. The 3D memory array may be monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In some example embodiments, the 3D memory array may include vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as or a similar structure to the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3A:
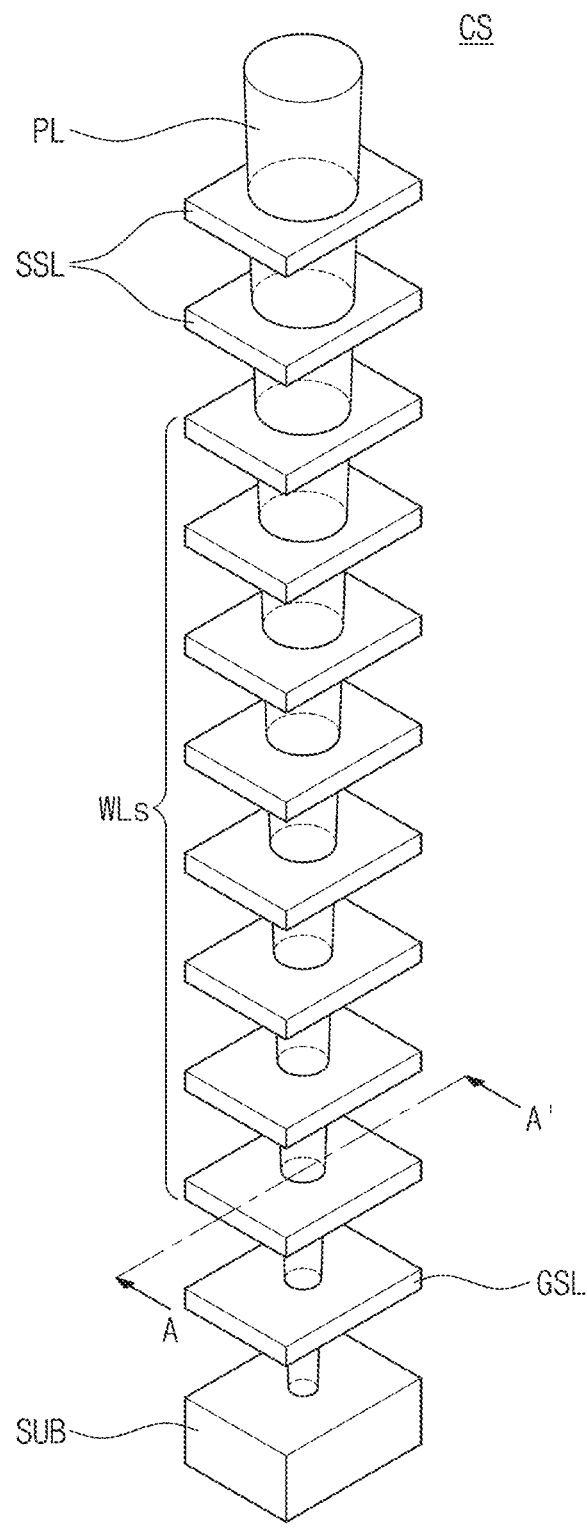
FIG. 3A is a diagram illustrating a structure of a cell string in a memory block of FIG. 2.
Figure 3B:
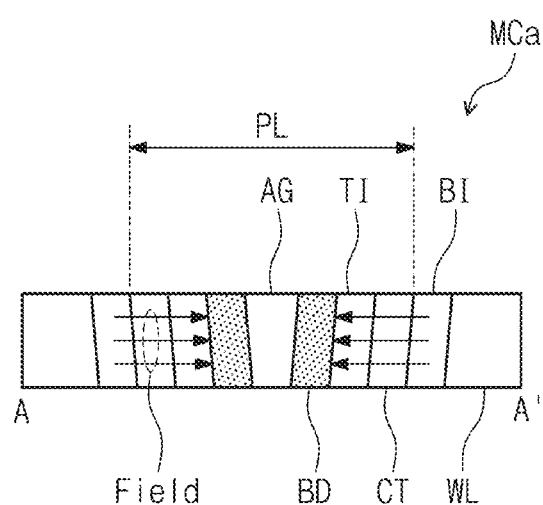
FIG. 3B is a diagram illustrating a structure of one memory cell of FIG. 3A.

FIGS. 3A and 3B are views illustrating a structure of a cell string in the memory block BLKa of FIG. 2.

Referring to FIGS. 2, 3A, and 3B, a pillar PL that extends in a direction perpendicular to the substrate SUB and is in contact with the substrate SUB is provided on the substrate SUB. A ground selection line GSL, word lines WL, and string selection lines SSL may be formed of conductive materials parallel to the substrate SUB, for example, metal materials. The pillar PL may be in contact with the substrate SUB through the conductive materials that form the string selection lines SSL, the word lines WL, and the ground selection line GSL. Also, the word lines WL may include a dummy word line connected to a dummy memory cell that is not used to store data. The dummy word line may be used for various purposes.

FIG. 3B shows a cross-sectional view of FIG. 3A taken along a line A-A'. A cross-sectional view of a memory cell MCa corresponding to one word line is illustrated. The pillar PL may include a cylindrical body BD. An air gap AG may be defined in the interior of the body BD. The body BD may include P-type silicon and may be a region where a channel will be formed. The pillar PL may further include a cylindrical tunnel insulating layer TI surrounding or partially surrounding the body BD and a cylindrical charge trap layer CT surrounding or partially surrounding the tunnel insulating layer TI. A blocking insulating layer BI may be provided between a word line and the pillar PL. The body BD, the tunnel insulating layer TI, the charge trap layer CT, the blocking insulating layer BI, and one word line may constitute (or be included within) a charge trap type transistor that is formed in a direction perpendicular to the substrate SUB or to an upper surface of the substrate SUB. The string selection transistor SST, the ground selection transistor GST, and each of the memory cells MC may have the same structure as or a similar structure to the memory cell MCa.

In the process of manufacturing the cell string CS, the shorter a distance from the substrate SUB, the smaller a width of the pillar PL or the cross-sectional area parallel to the upper surface of the substrate SUB. Accordingly, when the same voltage or a similar voltage is applied to bodies of the ground selection transistor GST, the memory cells MC, and the string selection transistors SST and the same voltage or a similar voltage is applied to the ground selection line GSL, the word lines WL, and the string selection lines SSL, an electric field formed at a memory cell or the ground selection transistor GST that is adjacent to the substrate SUB is greater than an electric field formed at a memory cell or the string selection transistor SST that is distant from the substrate SUB. The above characteristic has an influence on program disturbance that occurs while the program operation is performed. To solve an issue due to the geometrical characteristic of the cell string CS, as described above, a program order may be determined such that memory cells distant from the substrate SUB are first programmed.

Figure 4:
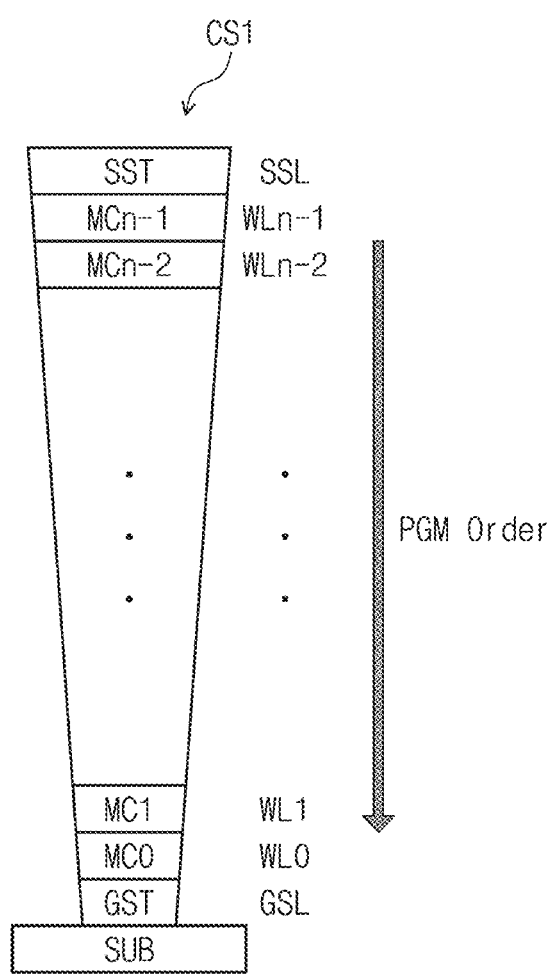
FIG. 4 is a diagram illustrating memory cells included in a cell string and a program order thereof, according to some example embodiments.

FIG. 4 is a diagram illustrating memory cells in a cell string and a program order thereof, according to some example embodiments. Here, one cell string CS1 may include a plurality of memory cells MC0 to MCn−1 (n being a natural number of 1 or more) (e.g., the memory cell MC0, the memory cell MC1, . . . , the memory cell MCn−2, and the memory cell MCn−1). For example, the memory cell MC0 may be the closest to the substrate SUB, and the memory cell MCn may be the most distant from the substrate SUB (or may be the closest to the string selection line SSL).

Referring to FIG. 4, in the first cell string CS1, a size of a memory cell may increase as a distance from the substrate SUB increases. According to some example embodiments, there may be first programmed a memory cell, the program speed of which is relatively slow (or in which a diameter of a channel hole is relatively great). For example, the non-volatile memory device 100 may first select a word line WLn−1 of the memory cell MCn−1 for the program operation. The remaining word lines WLn−2, WLn−3 . . . , WL1, and WL0 may be sequentially selected from the top to the bottom. According to some example embodiments, any or all of the cell strings CS may be the same as or similar to the first cell string CS1.

Figure 5:
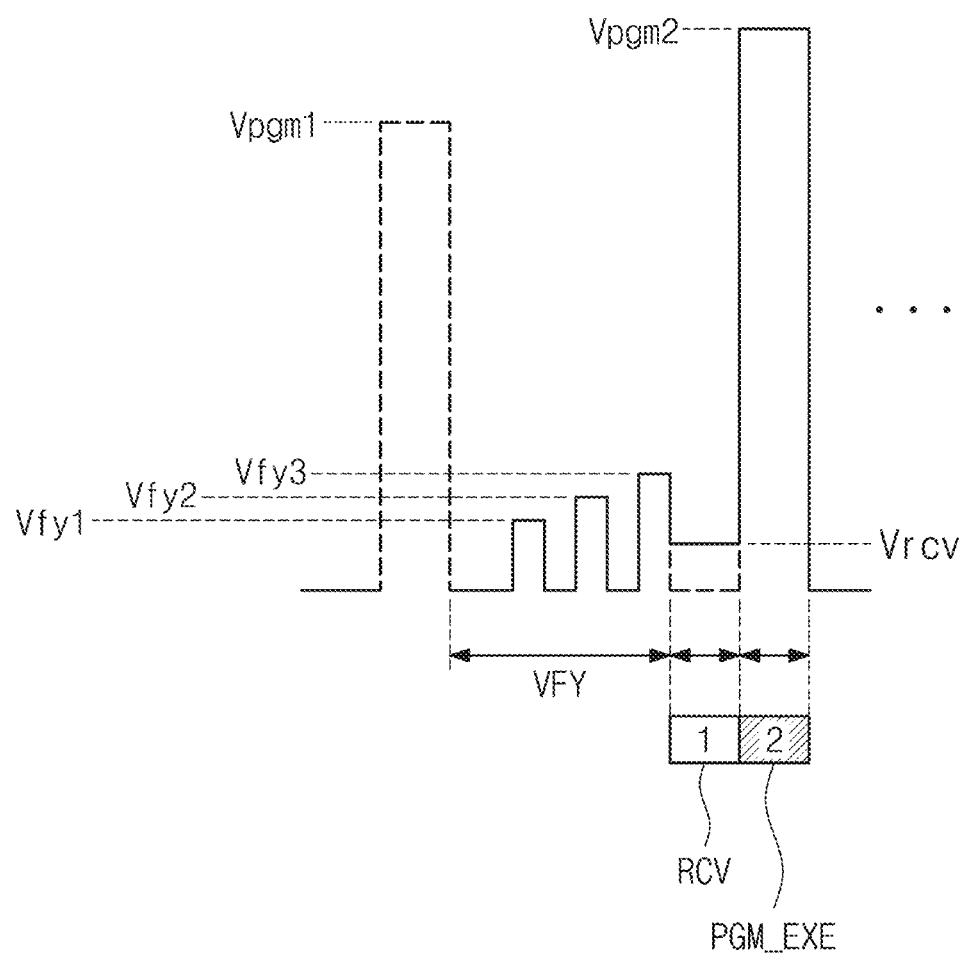
FIG. 5 is a waveform diagram illustrating a program operation of some example embodiments.

FIG. 5 is a waveform diagram illustrating a program operation of some example embodiments. Referring to FIG. 5, the program operation of some example embodiments may include a program verify period VFY, a recovery period RCV, and/or a program execution period PGM_EXE.

Program pulses Vpgm1 and Vpgm2 may be provided to a word line selected for the program operation in the form of a gradual incremental step pulse (e.g., incremental step pulse programming (ISPP)) First, after the program pulse Vpgm1 is applied to the selected word line, verify voltages Vfy1, Vfy2, and Vfy3 of different levels are sequentially provided to the selected word line. The three verify voltages Vfy1, Vfy2, and Vfy3 are illustrated in FIG. 5, but some example embodiments are not limited thereto. It may be well understood that at least one of verify voltages of various levels may be applied to the selected word line in the form of a pulse in the program verify period VFY.

Operations of recovering and initializing a word line may be performed in parallel in the recovery period RCV. That is, the recovery voltage Vrcv may be applied to all the word lines to which a read pass voltage Vread or the verify voltages Vfy1, Vfy2, and Vfy3 were applied. Afterwards, the recovery voltage Vrcv may be supplied to the selected word line and word lines adjacent to the selected word line, and the remaining word lines may be discharged to a ground level. In addition, a precharge voltage Vprch may be applied to the common source line CSL of a cell string. Accordingly, a channel of the cell string may be initialized to a level corresponding to the precharge voltage Vprch. In this case, hot electron injection due to negative boosting that is able to be generated in the worst case may be prevented or reduced. This will be described in detail with reference to drawings to be described below. According to some example embodiments, the precharge voltage Vprch may increase or be higher when a driving temperature of a non-volatile memory device (e.g., the non-volatile memory device 100) is lower than a reference temperature TH or when a number of unprogrammed memory cells in the cell string is less than or equal to a reference value. According to some example embodiments, the reference value may be a design parameter determined through empirical study.

In the program execution period PGM_EXE, a level of a pass voltage to be applied to unselected word lines may vary depending on a location of the selected word line. In the case where the selected word line is located above a reference location, a first pass voltage Vpass1 may be applied to unselected word lines. Additionally, in this case, a second pass voltage Vpass2 that is lower in level than the first pass voltage Vpass1 may be applied to an unselected word line adjacent to the selected word line. According to some example embodiments, the reference location may be a design parameter determined through empirical study.

However, in the case where a location of the selected word line corresponds to the reference location or the selected word line is located below the reference location, a third pass voltage Vpass3 (here, Vpass3>Vpass1) may applied to some (e.g., the second word line group) of unselected word lines located above the selected word line. The second pass voltage VPass2 or a voltage lower than the second pass voltage Vpass2 may be applied to some (e.g., the first word line group) of unselected word lines located below the selected word line. In addition, in the case where a driving temperature of the non-volatile memory device 100 is lower than a reference temperature TH, a level of the third pass voltage Vpass3 may become higher, and a level of the second pass voltage Vpass2 may become lower. According to some example embodiments, the reference temperature may be a design parameter determined through empirical study.

Figure 6:
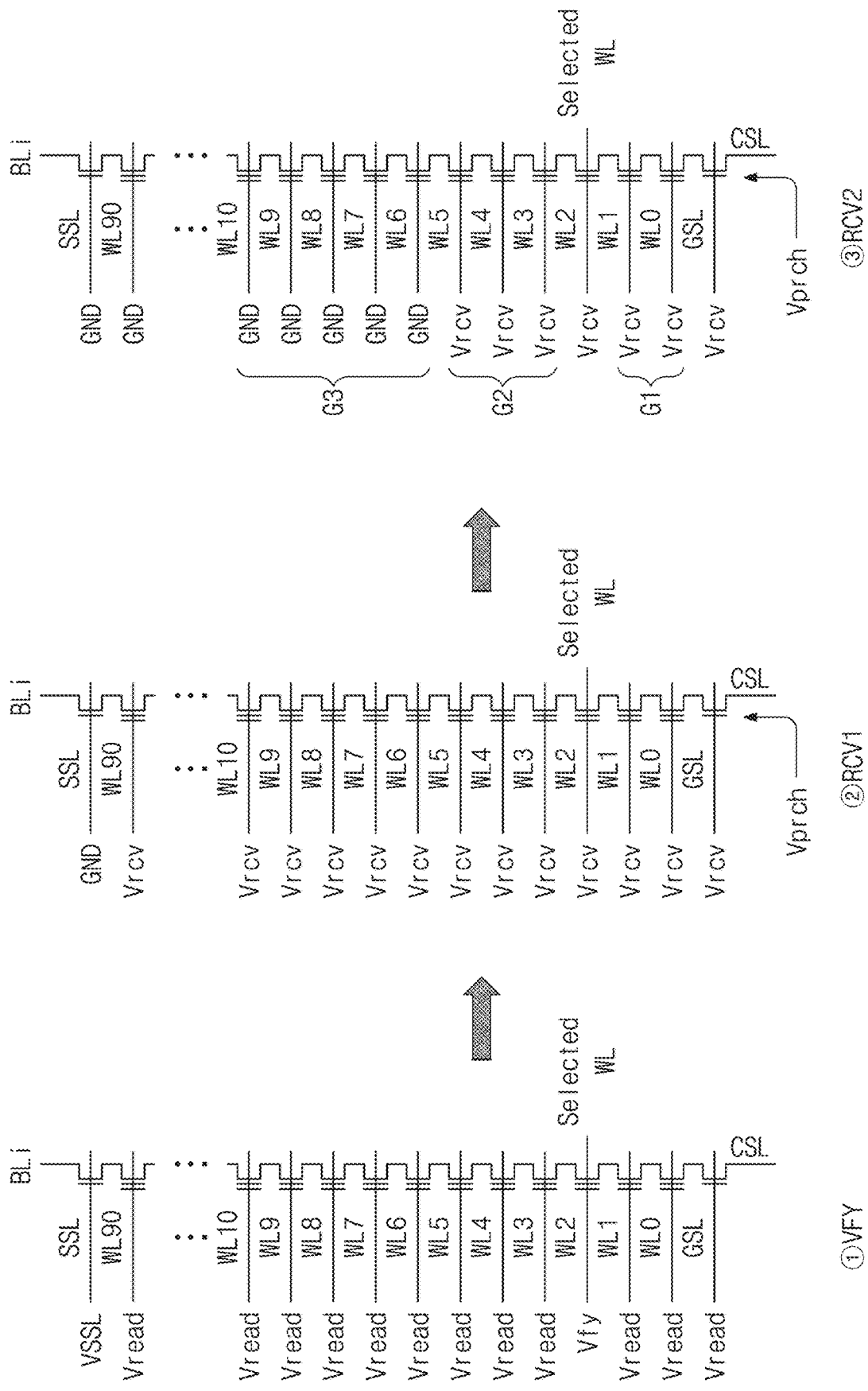
FIG. 6 is a diagram illustrating how word line voltages change in a recovery operation of some example embodiments.

FIG. 6 is a diagram illustrating how word line voltages change in a recovery operation of some example embodiments. Referring to FIG. 6, the recovery operation of some example embodiments includes the first recovery operation RCV1 and the second recovery operation RCV2. Here, it is assumed that a selected word line targeted for the program operation is the word line WL2 (or the third word line WL2 from the ground selection line GSL).

A program verify operation VFY is performed before the recovery operation (①). A verify voltage Vfy for verifying whether a memory cell successfully programmed is applied to the selected word line WL2. At the same time or contemporaneously, the read pass voltage Vread is applied to the remaining word lines. The read pass voltage Vread has a voltage level sufficient to fully turn on memory cells of all program states.

Then, the recovery operation of some example embodiments may be performed. The recovery operation of some example embodiments may include a first recovery phase RCV1 (②) and a second recovery phase RCV2 (③). Here, it is assumed that one cell string is connected with 91 word lines WL0 to WL90 (e.g., the word line WL0, the word line WL1, the word line WL2, the word line WL3, the word line WL4, the word line WL5, the word line WL6, the word line WL7, the word line WL8, the word line WL9, the word line WL10, . . . , the word line WL90). However, it may be well understood that the number of word lines is not limited to the above example.

In the first recovery phase RCV1, the recovery voltage Vrcv may be applied to all the word lines WL0 to WL90. The precharge voltage Vprch may be supplied through the common source line CSL for initializing a channel of the cell string. To initialize the channel through the common source line CSL, a ground voltage GND for turning off the string selection transistor SST may be provided to the string selection line SSL. In addition, the recovery voltage Vrcv may be applied to the ground selection line GSL for turning on the ground selection transistor GST. In some example embodiments, the recovery voltage Vrcv may be a voltage that is lower than the read pass voltage Vread and is higher than 0 V. Also, in some example embodiments, the precharge voltage Vprch may be a voltage that is lower than a power supply voltage VDD and is higher than 0 V.

In the second recovery phase RCV2, the precharge voltage Vprch provided to initialize the channel through the common source line CSL may be maintained. The recovery voltage Vrcv may be continuously supplied to the selected word line WL2 and a second word line group G2. The second word line group G2 means one or more word lines located above the selected word line WL2. However, the ground voltage GND or the recovery voltage Vrcv may be supplied to a first word line group G1. The first word line group G1 means one or more word lines located below the selected word line WL2. In some example embodiments, the recovery voltage Vrcv may be applied to the word line WL1 of the first word line group G1 and the ground voltage GND may be applied to the word line WL0 of the first word line group G1. However, in some example embodiments, the ground voltage GND may be applied to all the word lines WL0 and WL1 of the first word line group G1. In addition, the ground voltage GND may be applied to a third word line group G3. The third word line group G3 means the remaining word lines other than the first and second word line groups G1 and G2.

Figure 7:
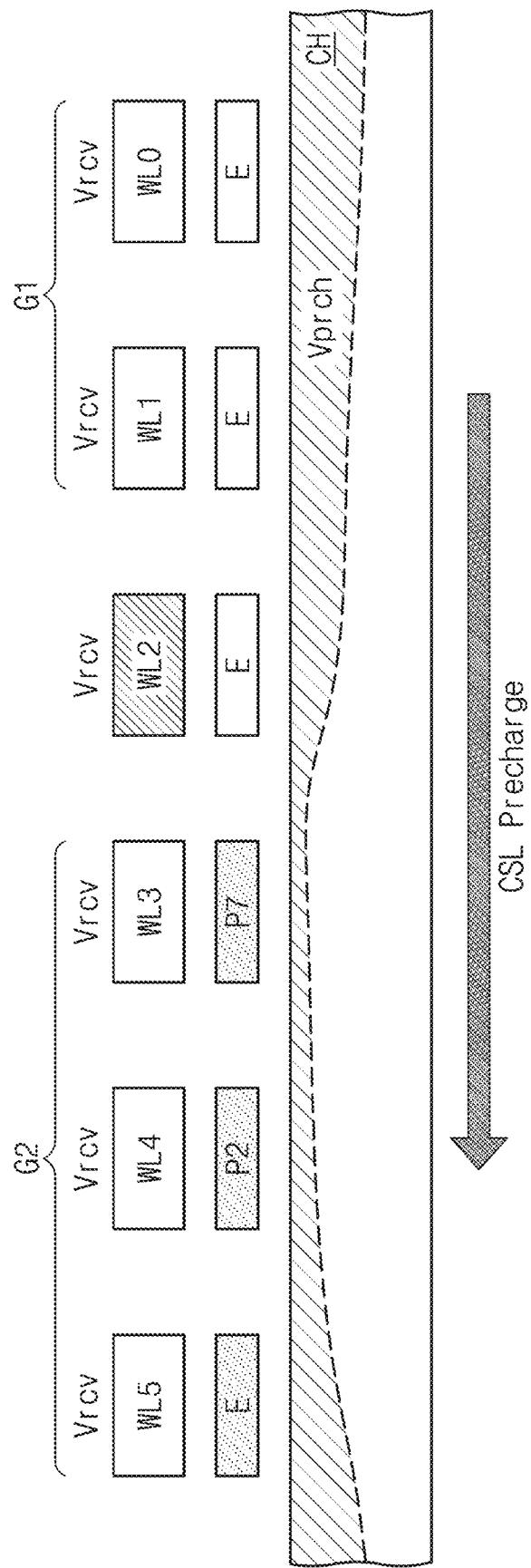
FIG. 7 is a diagram briefly illustrating a channel initialization effect in a first recovery phase of FIG. 6.

FIG. 7 is a diagram briefly illustrating a channel initialization effect in the first recovery phase RCV1 of FIG. 6. For convenience of description, in FIG. 7, it is assumed that memory cells of the selected word line WL2 and the first word line group G1 are in an erase state "E" and several memory cells of the second word line group G2 are in specific program states. That is, it is assumed that a memory cell connected to the word line WL3 is in a program state P7, a memory cell connected to the word line WL4 is in a program state P2, and a memory cell connected to the word line WL5 is in the erase state "E".

In the case where there is not applied the first recovery phase RCV1 in which the recovery voltage Vrcv of some example embodiments may be used, a channel off zone, that is, a local boosting region may be formed in a channel (depicted as a channel CH) corresponding to the memory cells of the second word line group G2. In the case of performing a general recovery operation, upper word lines WL3 to WL90 of the selected word line WL2 in the verify operation may be discharged to a level of the ground voltage GND after supplied with the read pass voltage Vread. As such, a boosted channel off zone may experience the negative down-coupling. This is called "negative boosting". As a result, negative charges of the channel off zone may increase.

However, because a channel is localized, there may be no path where the increased negative charges may be discharged. In this case, a voltage of the channel off zone may be a negative voltage through the negative boosting, and a voltage of a channel corresponding to memory cells connected to lower word lines WL0 and WL1 of the selected word line WL2 may be the ground voltage GND (e.g., 0 V) because the channel is connected with the common source line CSL. As such, a difference between the negative voltage of the channel off zone and the ground voltage (e.g., 0 V) becomes greater, and thus, the memory cell that is connected to the selected word line WL2 and has the erase state "E" may be programmed due to the hot electron injection (HCI).

In contrast, the non-volatile memory device 100 according to some example embodiments may float all the word lines WL0 to WL90 by using the recovery voltage Vrcv, for reducing the read disturbance caused by the negative boosting in the recovery operation. That is, the word lines WL0 to WL90 are discharged to the recovery voltage Vrcv higher than 0 V from the read pass voltage Vread. As such, the channel off zone is not formed in a channel. This means that the disturbance due to the hot electron injection (HCI) may be prevented or reduced.

In some example embodiments, the recovery voltage Vrcv is lower than the read pass voltage Vread and is higher than 0 V. The recovery voltage Vrcv may be a positive voltage sufficient to turn on a memory cell having the uppermost state (e.g., P7 in the case of a triple level cell (TLC)). For example, the recovery voltage Vrcv may be a driving voltage VDD for driving the non-volatile memory device 100.

The non-volatile memory device 100 according to some example embodiments may prevent or reduce the read disturbance by floating word lines at the recovery voltage Vrcv in the recovery operation.

Figure 8A:
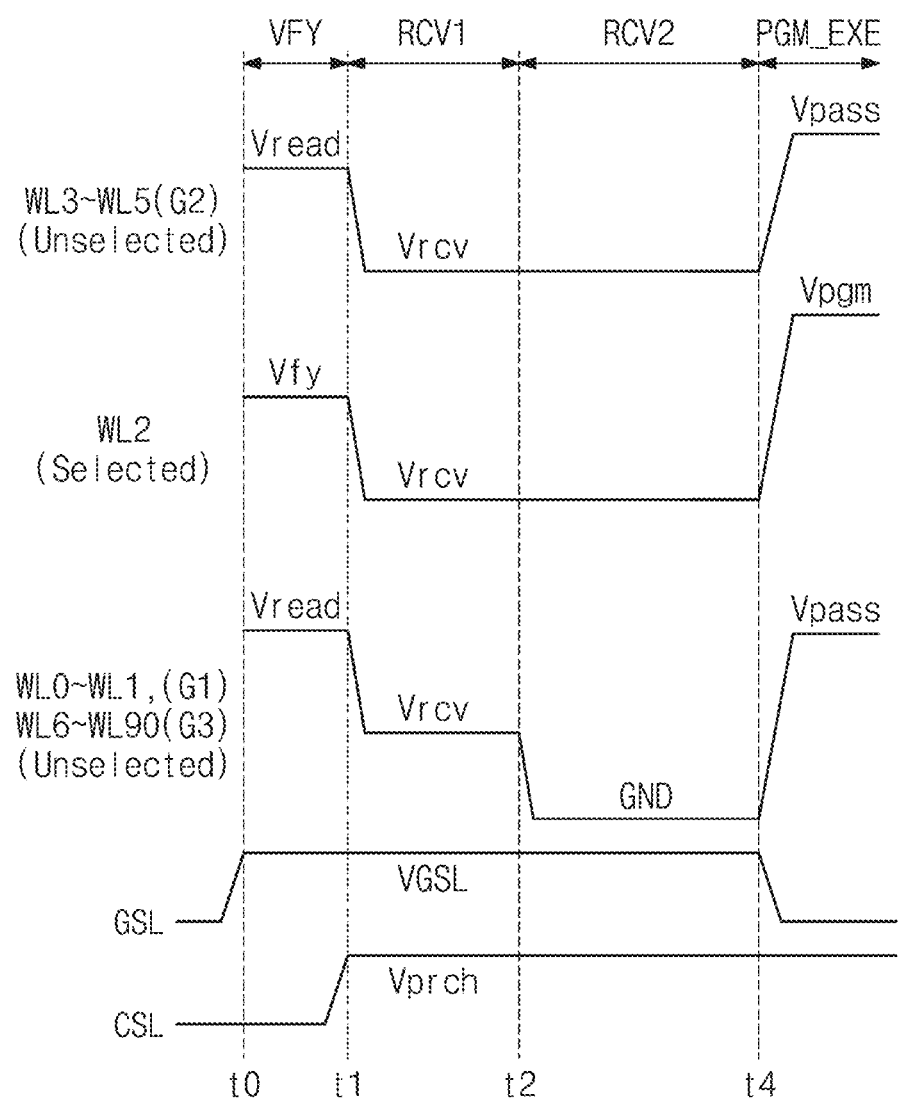
FIGS. 8A and 8B are waveform diagrams illustrating some example embodiments of a recovery operation.
Figure 8B:
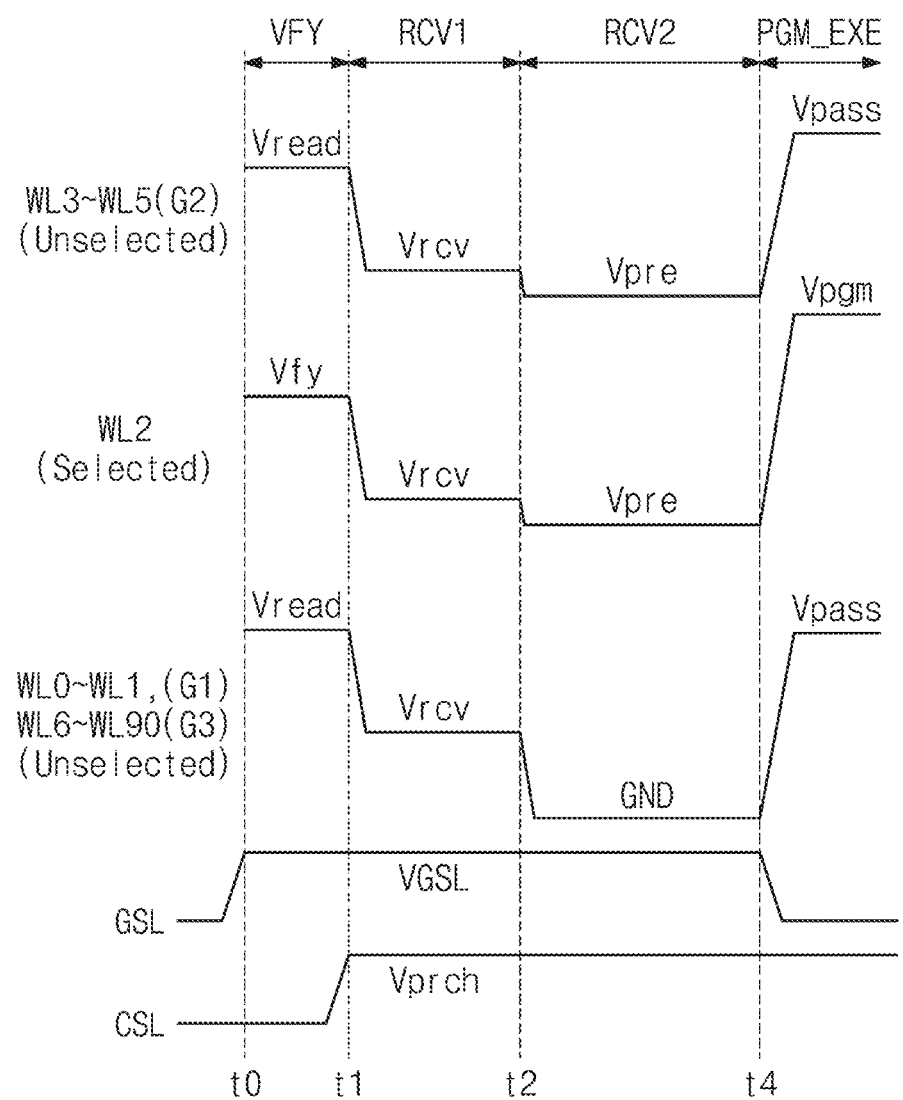

FIGS. 8A and 8B are waveform diagrams illustrating a recovery operation of some example embodiments. Referring to FIGS. 7 and 8A, the recovery operation of some example embodiments may be performed after a program verify phase VFY. The recovery operation of some example embodiments may be divided into the first recovery phase RCV1 and the second recovery phase RCV2.

The program verify phase VFY may be performed from a time t0 to a time t1. To determine whether programming is successful, the verify voltage Vfy may be applied to the selected word line WL2, and the read pass voltage Vread may be applied to the unselected word lines WL0, WL1, and WL3 to WL90. A ground selection voltage VGSL may be applied to the ground selection line GSL, and the common source line CSL may maintain a ground state.

The first recovery phase RCV1 may be performed from the time t1 to a time t2. In the first recovery phase RCV1, the recovery voltage Vrcv may be applied to all the word lines WL0 to WL90. The ground selection voltage VGSL may be applied to the ground selection line GSL. In particular, the precharge voltage Vprch for channel initialization may be applied to the common source line CSL.

The second recovery phase RCV2 may be performed from the time t2 to a time t4. In the second recovery phase RCV2, the recovery voltage Vrcv may be continuously supplied to the selected word line WL2 and the second word line group G2 located above the selected word line WL2. In contrast, word lines WL0 and WL1 of the first word line group G1 located below the selected word line WL2 and word lines WL6 to WL90 of the third word line group G3 may be discharged to the ground level GND.

Afterwards, in a program execution phase PGM_EXE, the ground selection line GSL may be discharged to the ground level at the time t4. The program voltage Vpgm may be applied to the selected word line WL2, and the pass voltage Vpass may be applied to the unselected word lines WL0, WL1, and WL3 to WL90.

As described above, the negative boosting that is able to occur in a channel during a recovery operation may be prevented or reduced through the recovery operation of some example embodiments that may be performed in the channel initialization operation.

Referring to FIG. 8B, the recovery operation of some example embodiments may be performed after the program verify phase VFY. The recovery operation of some example embodiments may be divided into the first recovery phase RCV1 and the second recovery phase RCV2. The program verify phase VFY and the first recovery phase RCV1 from the time t0 to the time t2 are the same as or substantially the same as those of FIG. 8A, and thus, additional description will be omitted to avoid redundancy.

The second recovery phase RCV2 may be performed from the time t2 to the time t4. In some example embodiments, in the second recovery phase RCV2, a second recovery voltage Vpre may be supplied to the selected word line WL2 and the second word line group G2 located above the selected word line WL2. The second recovery voltage Vpre may be lower in level than the recovery voltage Vrcv (hereinafter referred to as a "first recovery voltage Vrcv") provided in the first recovery phase RCV1. For example, the second recovery voltage Vpre may be 0 V or higher and may be lower than the first recovery voltage Vrcv. In contrast, the first word line group G1 located below the selected word line WL2 and the third word line group G3 may be discharged to the ground level GND.

Afterwards, the ground selection line GSL may be discharged to the ground level GND at the time t4 for the program execution phase PGM_EXE. The program voltage Vpgm may be applied to the selected word line WL2, and the pass voltage Vpass may be applied to the unselected word lines WL0, WL1, and WL3 to WL90.

As described above, the negative boosting that is able to occur in a channel during a recovery operation may be prevented or reduced through the recovery operation of some example embodiments that may be performed in the channel initialization operation.

FIGS. 9A to 9D are waveform diagrams illustrating some example embodiments of a recovery operation.

Figure 9A:
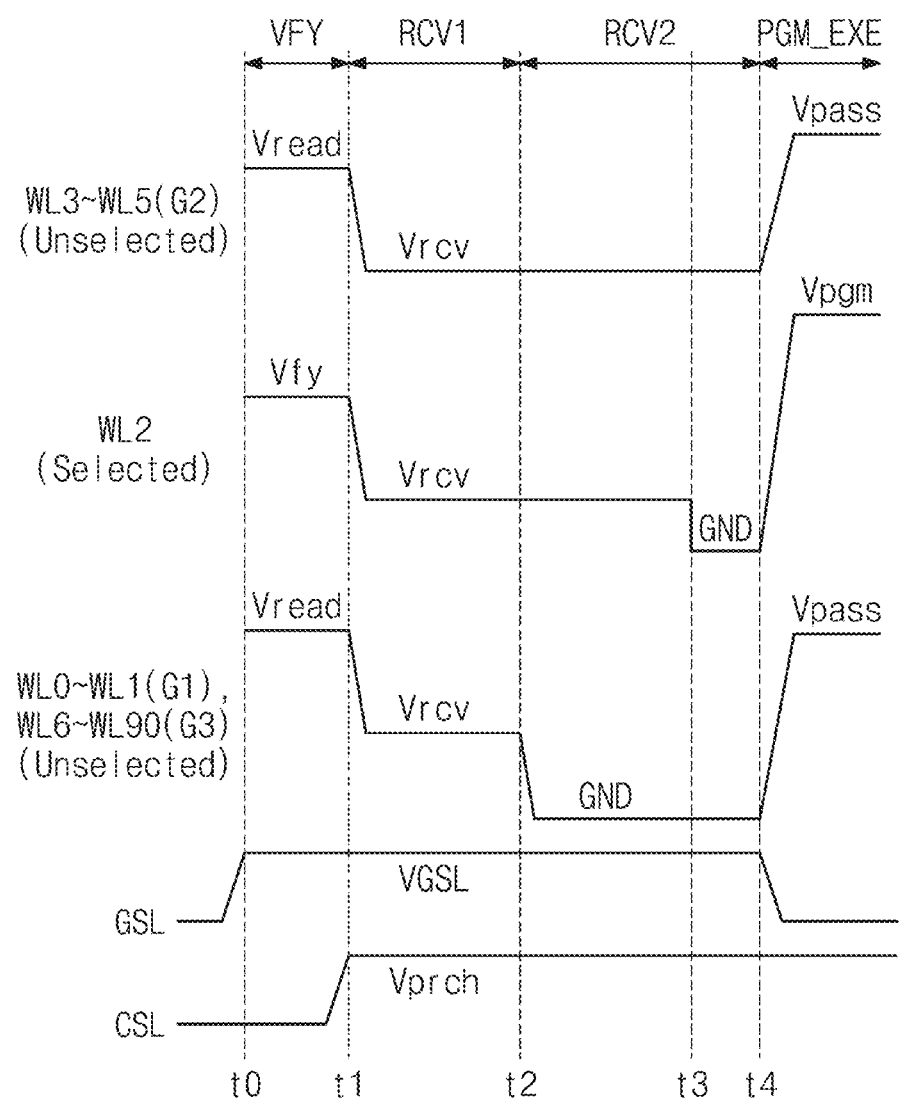
FIGS. 9A to 9D are waveform diagrams illustrating some example embodiments of a recovery operation.

Referring to FIG. 9A, the recovery operation according to some example embodiments includes the first recovery operation RCV1 and the second recovery operation RCV2. In some example embodiments, the program verify phase VFY, the first recovery phase RCV1, and the program execution phase PGM_EXE are the same as or similar to those described with reference to FIG. 8A. That is, operations from the time t0 to the time t2 are the same as or similar to those of FIG. 8A, and thus, additional description will be omitted to avoid redundancy. The second recovery phase RCV2 will be more fully described.

The second recovery phase RCV2 may be performed from the time t2 to a time t3. In the second recovery phase RCV2, the recovery voltage Vrcv may be continuously supplied to the selected word line WL2 and the word lines WL3 to WL5 of the second word line group G2 located above the selected word line WL2. In contrast, the word lines WL0 and WL1 of the first word line group G1 located below the selected word line WL2 and the word lines WL6 to WL90 of the third word line group G3 may be discharged to the ground level GND.

At the time t3, the selected word line WL2 may be discharged to the ground level GND. The accuracy of the program voltage Vpgm that is provided in the program execution phase PGM_EXE may be improved by discharging the selected word line WL2. At the time t4, the program voltage Vpgm may be applied to the selected word line WL2, and the pass voltage Vpass may be applied to the unselected word lines WL0, WL1, and WL3 to WL90.

Figure 9B:
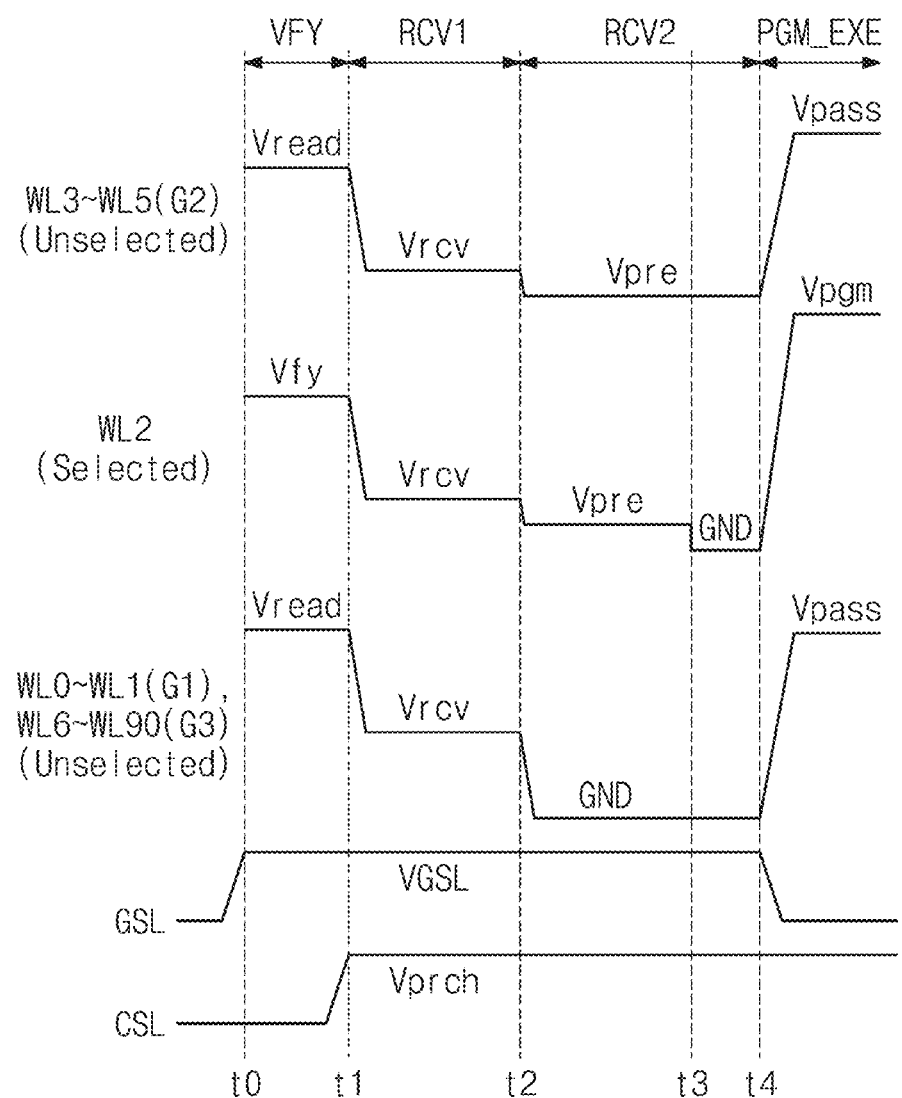

Referring to FIG. 9B, the recovery operation according to some example embodiments includes the first recovery operation RCV1 and the second recovery operation RCV2. In some example embodiments, the program verify phase VFY, the first recovery phase RCV1, and the program execution phase PGM_EXE are the same as or similar to those described with reference to FIG. 9A. That is, operations from the time t0 to the time t2 are the same as or similar to those of FIG. 8A, and thus, additional description will be omitted to avoid redundancy.

The second recovery phase RCV2 may be performed from the time t2 to the time t3. In the second recovery phase RCV2, the second recovery voltage Vpre may be supplied to the selected word line WL2 and the word lines WL3 to WL5 of the second word line group G2 located above the selected word line WL2. The second recovery voltage Vpre may be lower in level than the first recovery voltage Vrcv provided in the first recovery phase RCV1. For example, the second recovery voltage Vpre may be 0 V or higher and may be lower than the first recovery voltage Vrcv. In contrast, the word lines WL0 and WL1 of the first word line group G1 and the word lines WL6 to WL90 of the third word line group G3 may be discharged to the ground level GND.

At the time t3, the selected word line WL2 may be discharged to the ground level GND. In this case, the second recovery voltage Vpre may be continuously supplied to the word lines WL3 to WL5 of the second word line group G2, and the word lines WL0 and WL1 of the first word line group G1 and the word lines WL6 to WL90 of the third word line group G3 may be maintained at the ground level GND.

At the time t4, the ground selection line GSL may be discharged to the ground level GND for the program execution phase PGM_EXE. The program voltage Vpgm may be applied to the selected word line WL2, and the pass voltage Vpass may be applied to the unselected word lines WL0, WL1, and WL3 to WL90.

As described above, the negative boosting that is able to occur in a channel during a recovery operation may be effectively prevented or reduced through the recovery operation of some example embodiment performed in a channel initialization operation.

Figure 9C:
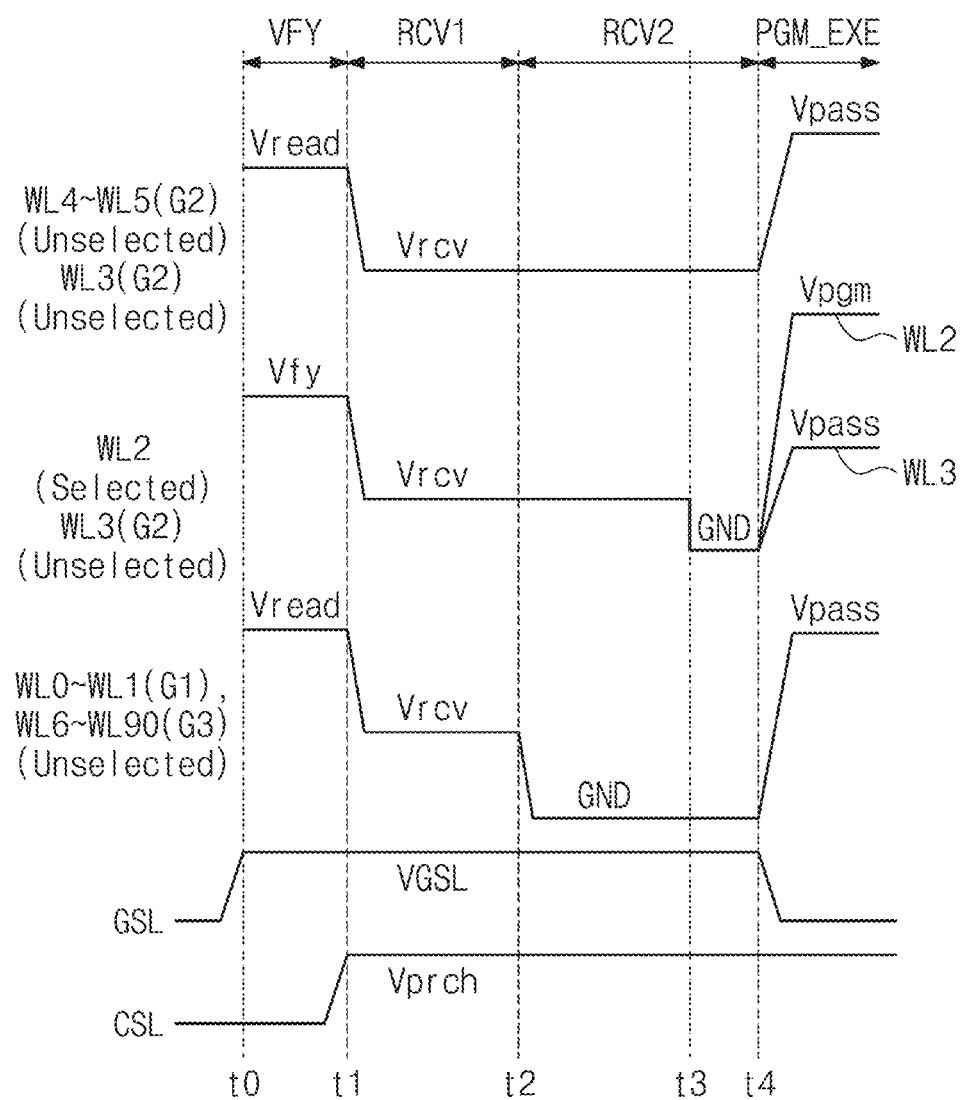

Referring to FIG. 9C, the recovery operation according to some example embodiments includes the first recovery operation RCV1 and the second recovery operation RCV2. In some example embodiments, the program verify phase VFY, the first recovery phase RCV1, and the program execution phase PGM_EXE are the same as or similar to those described with reference to FIG. 9A. That is, operations from the time t0 to the time t2 are the same as or similar to those of FIG. 9A (with the exception of the unselected word line WL3, as discussed further below), and thus, additional description will be omitted to avoid redundancy. The second recovery phase RCV2 will be more fully described.

The second recovery phase RCV2 may be performed from the time t2 to the time t3. In the second recovery phase RCV2, the recovery voltage Vrcv may be continuously supplied to the selected word line WL2 and the second word line group G2 located above the selected word line WL2. In contrast, the word lines WL0 and WL1 of the first word line group G1 located below the selected word line WL2 and the word lines WL6 to WL90 of the third word line group G3 may be discharged to the ground level GND.

At the time t3, the selected word line WL2 and the unselected word line WL3 being an upper word line immediately adjacent or adjacent to the selected word line WL2 may be discharged to the ground level GND. The accuracy of the program voltage Vpgm that is provided in the program execution phase PGM_EXE may be improved by discharging the selected word line WL2 and the unselected word line WL3.

At the time t4, the program voltage Vpgm may be applied to the selected word line WL2, and the pass voltage Vpass may be applied to the unselected word lines WL0, WL1, and WL3 to WL90. According to some example embodiments, the unselected word line WL3 may be subjected to the same voltages as or similar voltages to those applied to the unselected word lines WL4-WL5 of the second word line group G2 from the time t1 to the time t2 and at the time t4. The unselected word line WL3 may be subjected to the same voltages as or similar voltages to those applied to the selected word line WL2 from the time t2 to the time t4.

Figure 9D:
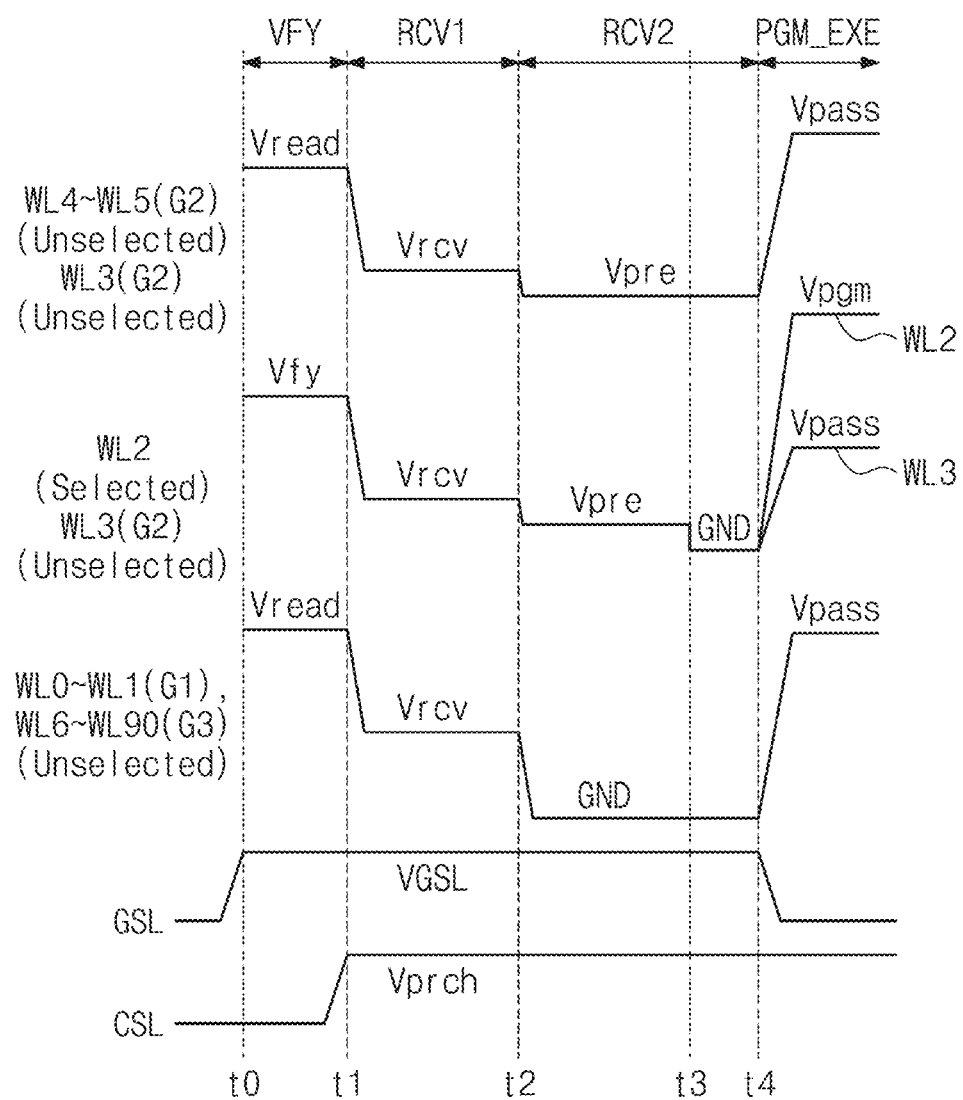

Referring to FIG. 9D, the recovery operation according to some example embodiments includes the first recovery operation RCV1 and the second recovery operation RCV2. In some example embodiments, the program verify phase VFY, the first recovery phase RCV1, and the program execution phase PGM_EXE are the same as or similar to those described with reference to FIG. 9A. That is, operations from the time t0 to the time t2 are the same as or similar to those of FIG. 9A (with the exception of the unselected word line WL3, as discussed further below), and thus, additional description will be omitted to avoid redundancy. The second recovery phase RCV2 will be more fully described.

The second recovery phase RCV2 may be performed from the time t2 to the time t3. In the second recovery phase RCV2, the second recovery voltage Vpre may be supplied to the selected word line WL2 and the word lines WL3 to WL5 of the second word line group G2 located above the selected word line WL2. In contrast, the word lines WL0 and WL1 of the first word line group G1 and the word lines WL6 to WL90 of the third word line group G3 may be discharged to the ground level GND. Here, the second recovery voltage Vpre may be lower in level than the first recovery voltage Vrcv provided in the first recovery phase RCV1. For example, the second recovery voltage Vpre may be 0 V or higher and may be lower than the first recovery voltage Vrcv.

From the time t3 to the time t4, the selected word line WL2 and the unselected word line WL3 being an upper word line immediately adjacent or adjacent to the selected word line WL2 may be discharged to the ground level GND. In this case, the second recovery voltage Vpre may be continuously supplied to the remaining word lines WL4 and WL5 of the second word line group G2 other than the unselected word line WL3. In contrast, the word lines WL0 and WL1 of the first word line group G1 and the word lines WL6 to WL90 of the third word line group G3 may be maintained at the ground level GND.

At the time t4, the program voltage Vpgm may be applied to the selected word line WL2, and the pass voltage Vpass may be applied to the unselected word lines WL0, WL1, and WL3 to WL90. According to some example embodiments, the unselected word line WL3 may be subjected to the same voltages as or similar voltages to those applied to the unselected word lines WL4-WL5 of the second word line group G2 from the time t1 to the time t2 and at the time t4. The unselected word line WL3 may be subjected to the same voltages as or similar voltages to those applied to the selected word line WL2 from the time t2 to the time t4.

Figure 10:
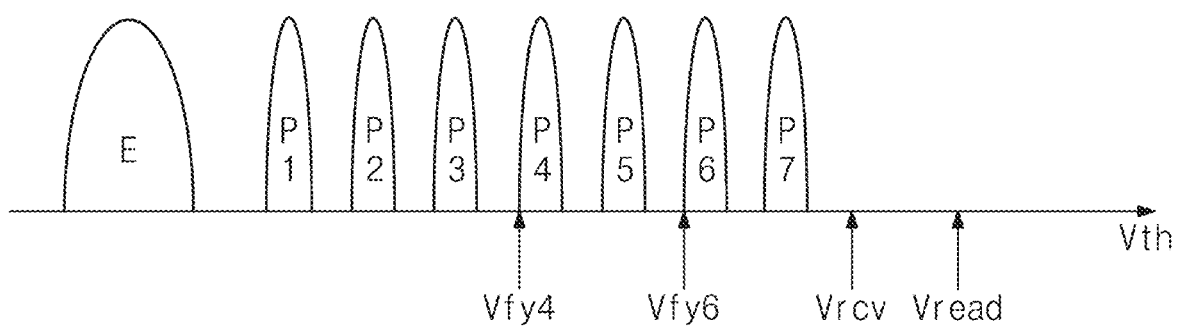
FIG. 10 is a diagram illustrating threshold voltage distributions associated with a 3-bit memory cell to describe some example embodiments.

FIG. 10 is a diagram illustrating threshold voltage distributions associated with a 3-bit memory cell according to some example embodiments. Referring to FIG. 10, a memory cell may be programmed to one of an erase state "E" and a plurality of program states P1 to P7.

The above-described verify voltage Vfy may include voltages for identifying the plurality of program states P1 to P7 (e.g., verify voltages Vfy4, Vfy6, etc.). For example, a verify voltage Vfy4 may have a voltage level for identifying whether memory cells targeted for the program state P4 are successfully programmed.

The recovery voltage Vrcv of some example embodiments may be lower than the read pass voltage Vread and may be higher than an upper limit of the uppermost program state P7. However, the level of the recovery voltage Vrcv is not limited to the above example. The recovery voltage Vrcv may be adjusted in consideration of negative boosting and/or read disturbance. For example, the recovery voltage Vrcv may be the driving voltage VDD used as a power supply voltage of the non-volatile memory device 100.

Figure 11A:
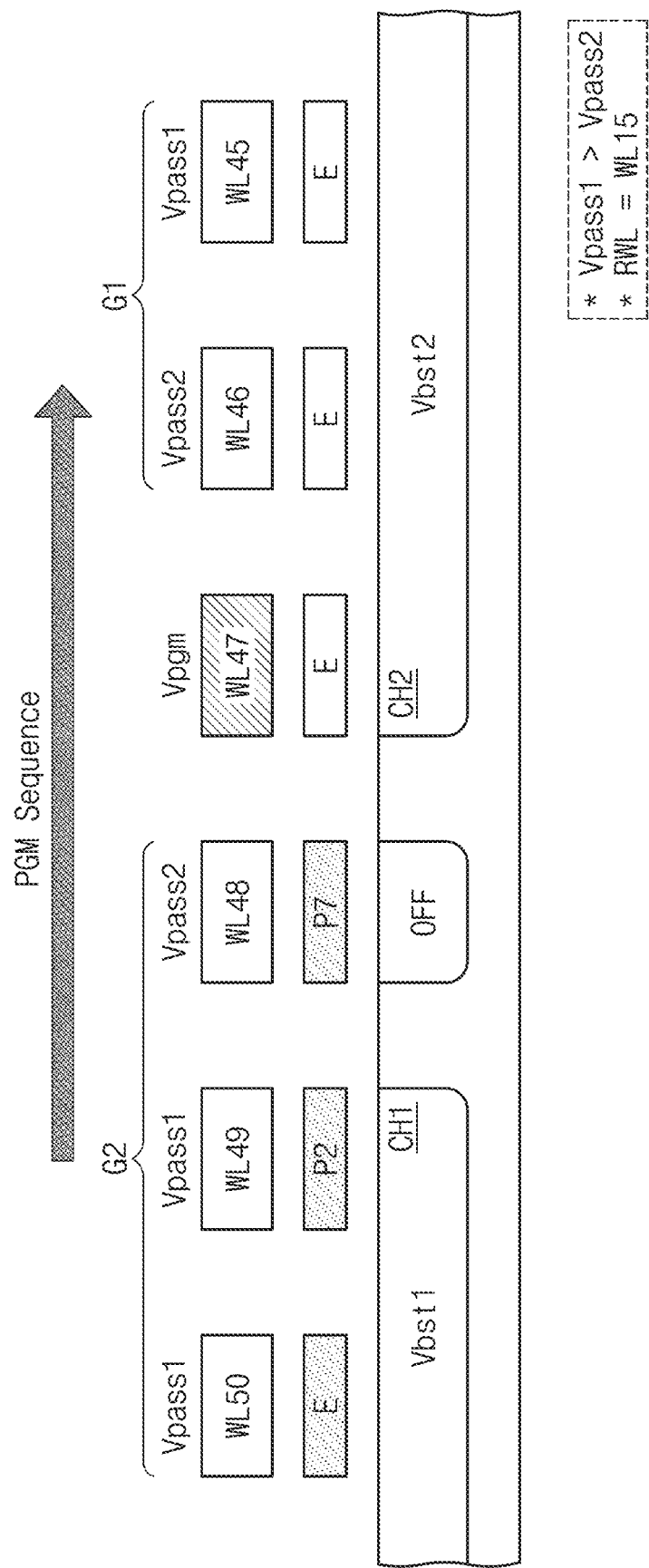
FIGS. 11A and 11B are diagrams illustrating characteristics of voltages applied to word lines in a program execution phase of some example embodiments.
Figure 11B:
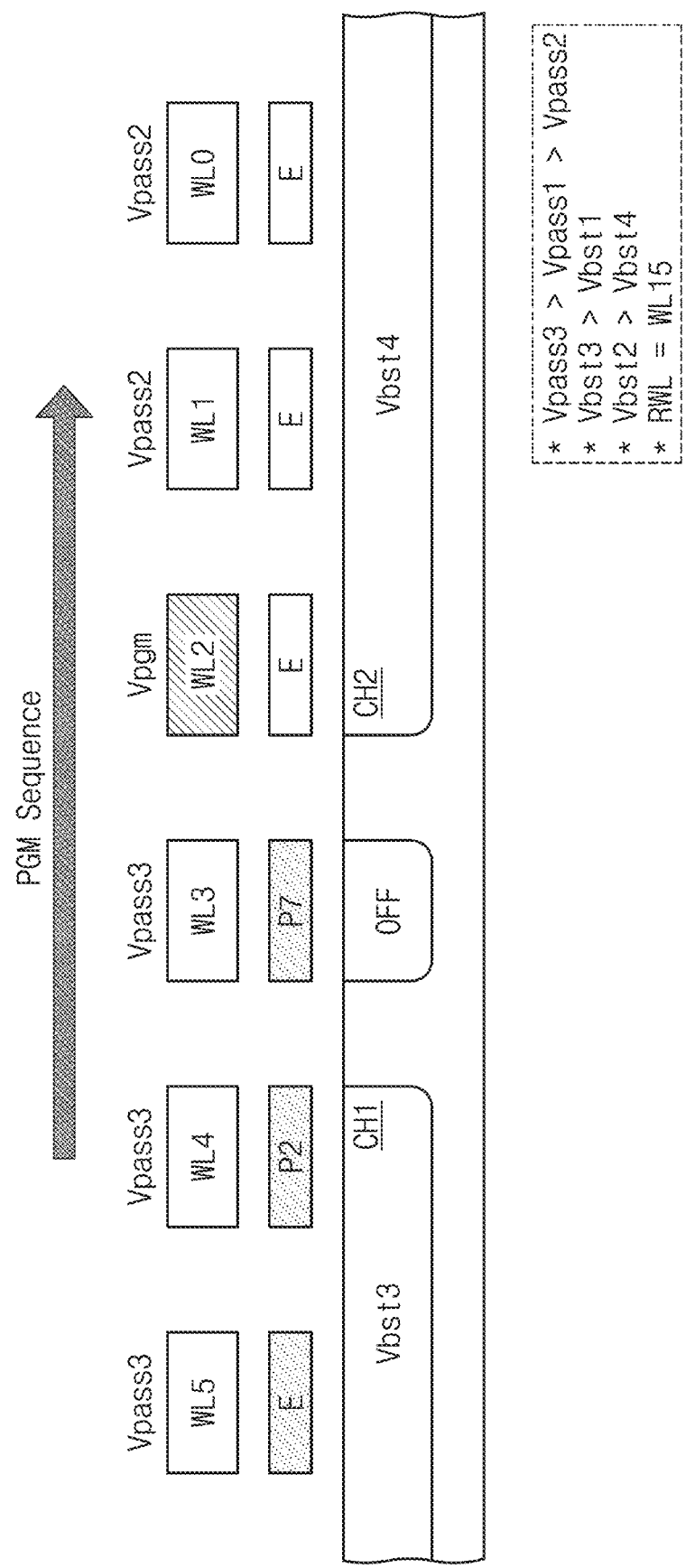

FIGS. 11A and 11B are diagrams illustrating characteristics of voltages applied to word lines in a program execution phase of some example embodiments. FIG. 11A shows a channel and word line voltages in the case where a word line selected for the program operation is located above a reference word line RWL. FIG. 11B shows a channel and word line voltages in the case where the selected word line is located below the reference word line RWL.

Here, it is assumed that the reference word line RWL is a word line WL15 in a sequence where programming is performed in the order of an upper word line to a lower word line. The reference word line RWL means a word line where the hot electron injection (HCI) becomes serious or detrimental due to a potential difference of local boosting channels and thus a condition for applying a pass voltage in the program operation is changed. A condition for applying pass voltages to word lines located above the reference word line RWL in the program operation is referred to as a "first pass condition". A condition for applying a pass voltage to the reference word line RWL and word lines located below the reference word line RWL in the program operation is referred to as a "second pass condition". As will be described later, a third pass condition where an offset may be added to the second pass condition may be considered based on the degree of hot electron injection varying depending on a temperature.

FIG. 11A shows the first pass condition that may be applied when the program operation is performed on the word lines located above the reference word line RWL. For example, when the word line WL47 is selected for the program operation, the selected word line WL47 is much more distant or more distant from a substrate than the reference word line RWL. In this case, pass voltages that are applied in the program operation may be determined in compliance with the first pass condition. According to the first pass condition, the first pass voltage Vpass1 or the second pass voltage Vpass2 (Vpass2<Vpass1) may be applied to the word lines WL48 to WL90 located above the selected word line WL47. The first pass voltage Vpass1 or the second pass voltage Vpass2 (Vpass2<Vpass1) may be applied to the word lines WL0 to WL46 located below the selected word line WL47. In particular, the second pass voltage Vpass2 that is lower than the first pass voltage Vpass1 may be applied to the word lines WL46 and WL48 immediately adjacent or adjacent to the selected word line WL47, and the first pass voltage Vpass1 may be applied to the remaining word lines WL0 to WL45, and WL49 and WL50 to WL90.

FIG. 11B shows the second pass condition that may be applied when the program operation is performed on the word lines located below the reference word line RWL. For example, when the word line WL2 is selected for the program operation, the selected word line WL2 is much closer or closer to the substrate than the reference word line RWL. In this case, pass voltages that are applied in the program operation may be determined in compliance with the second pass condition. According to the second pass condition, the third pass voltage Vpass3 (Vpass3>Vpass1) may be applied to the second word line group WL3 to WLj (j being a natural number: 4<j<90) located above the selected word line WL2. The second pass voltage Vpass2 (Vpass2<Vpass1) is applied to the first word line group WL0 to WL1 located below the selected word line WL2. Here, the number of word lines belonging to the second word line group (e.g., WL3 to WLj) in the second pass condition is more than in the first pass condition. Also, the level change of pass voltages in the first pass condition and the second pass condition is not limited to the above example.

Figure 12A:
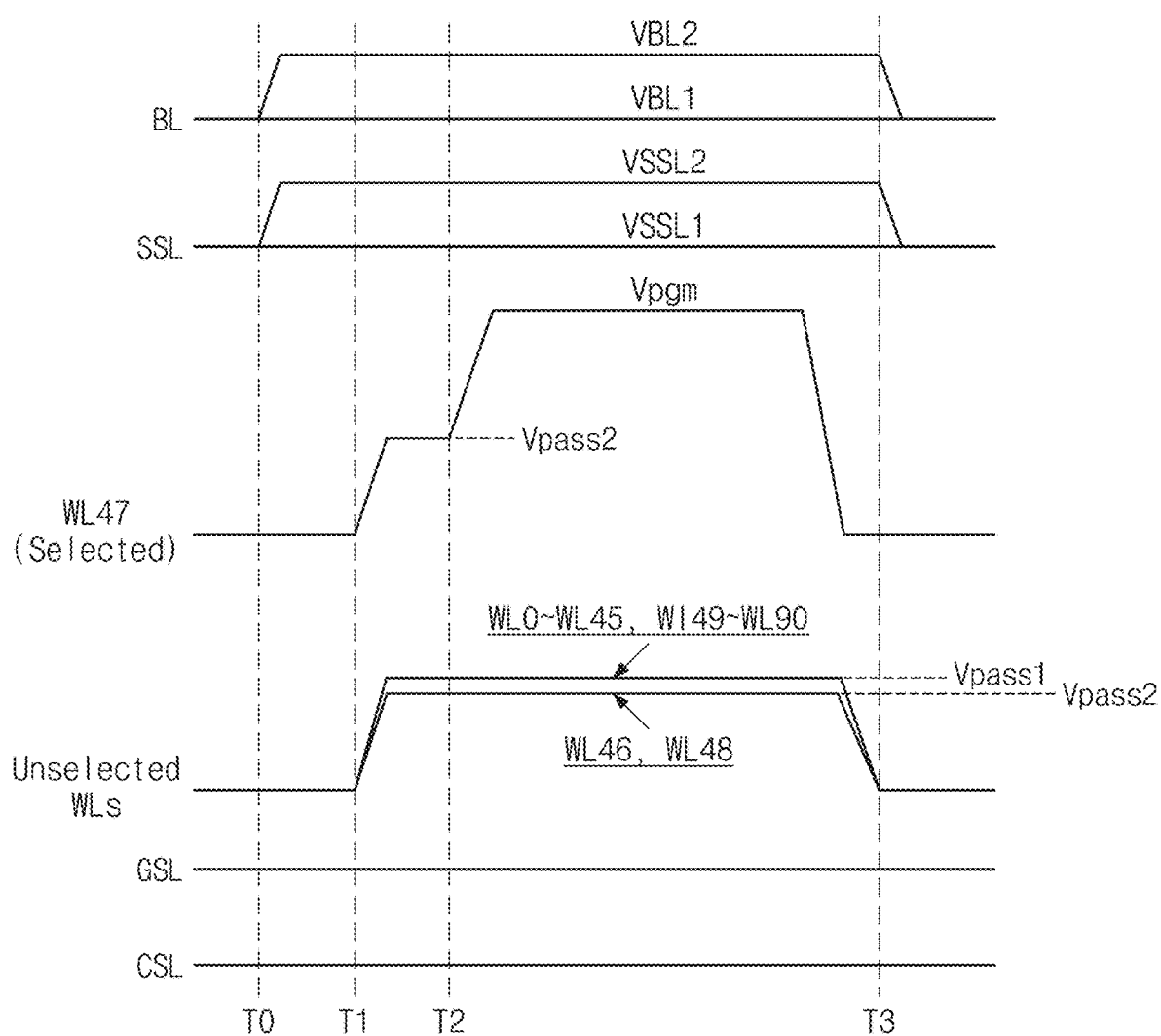
FIG. 12A is a waveform diagram illustrating word line voltages of a first pass condition, which are applied to word lines located above a reference word line in a program operation.

FIG. 12A is a waveform diagram illustrating word line voltages of a first pass condition, which may be applied to word lines located above the reference word line RWL in a program operation. Referring to FIG. 12A, when the word line WL47 is selected for the program operation, the selected word line WL47 may be much more distant or more distant from the substrate than the reference word line RWL. In this case, pass voltages that are applied in the program operation may be determined in compliance with the first pass condition.

At a time T0, a second bit line voltage VBL2 may be applied to an unselected bit line (or a program-inhibited bit line). For example, the second bit line voltage VBL2 may be the power supply voltage VDD. According to this bias condition, memory cells connected to the unselected bit line may be program inhibited. In the program operation, a selected bit line may be maintained at a level of a first bit line voltage VBL1. For example, the first bit line voltage VBL1 may be the ground voltage GND. In addition, at the time T0, a second string selection voltage VSSL2 may be applied to a selected string selection line, and a first string selection voltage VSSL1 may be applied to an unselected string selection line. For example, the second string selection voltage VSSL2 may be the power supply voltage VDD.

At a time T1, the pass voltages Vpass1 and Vpass2 may be applied to word lines. Here, the first pass voltage Vpass1 or the second pass voltage Vpass2 (Vpass2<Vpass1) may be applied to the word lines WL48 to WL90 located above the selected word line WL47. That is, the first pass voltage Vpass1 may be applied to the word lines WL49 to WL90, and the second pass voltage Vpass2 may be applied to the word line WL48 immediately adjacent or adjacent to the selected word line WL47. The second pass voltage Vpass2 may be applied to the selected word line WL47. Also, the first pass voltage Vpass1 or the second pass voltage Vpass2 may be applied to the word lines WL0 to WL46 located below the selected word line WL47. In particular, the second pass voltage Vpass2 that is lower than the first pass voltage Vpass1 may be applied to the word lines WL46 and WL48 immediately adjacent or adjacent to the selected word line WL47, and the first pass voltage Vpass1 may be applied to the remaining word lines WL0 to WL45 and WL49 to WL90.

At a time T2, the program voltage Vpgm is applied to the selected word line WL47. There may be programmed memory cells of selected strings that are connected to the selected word line WL47. According to the first pass condition, the above bias condition associated with the unselected word lines WL0 to WL46 and WL48 to WL90 may be continuously maintained. In this case, channels of cell strings connected to the unselected string selection line maintain a boosting state from the time T1 to a time T3. Accordingly, in the unselected cell strings, memory cells connected to the selected word line WL47 may be program inhibited.

At the time T3, the program voltage Vpgm and the pass voltages Vpass1 and Vpass2 supplied to the word lines may be recovered.

The word line voltages of the first pass condition, which may be applied to the word lines located above the reference word line RWL in the program operation, are described above.

Figure 12B:
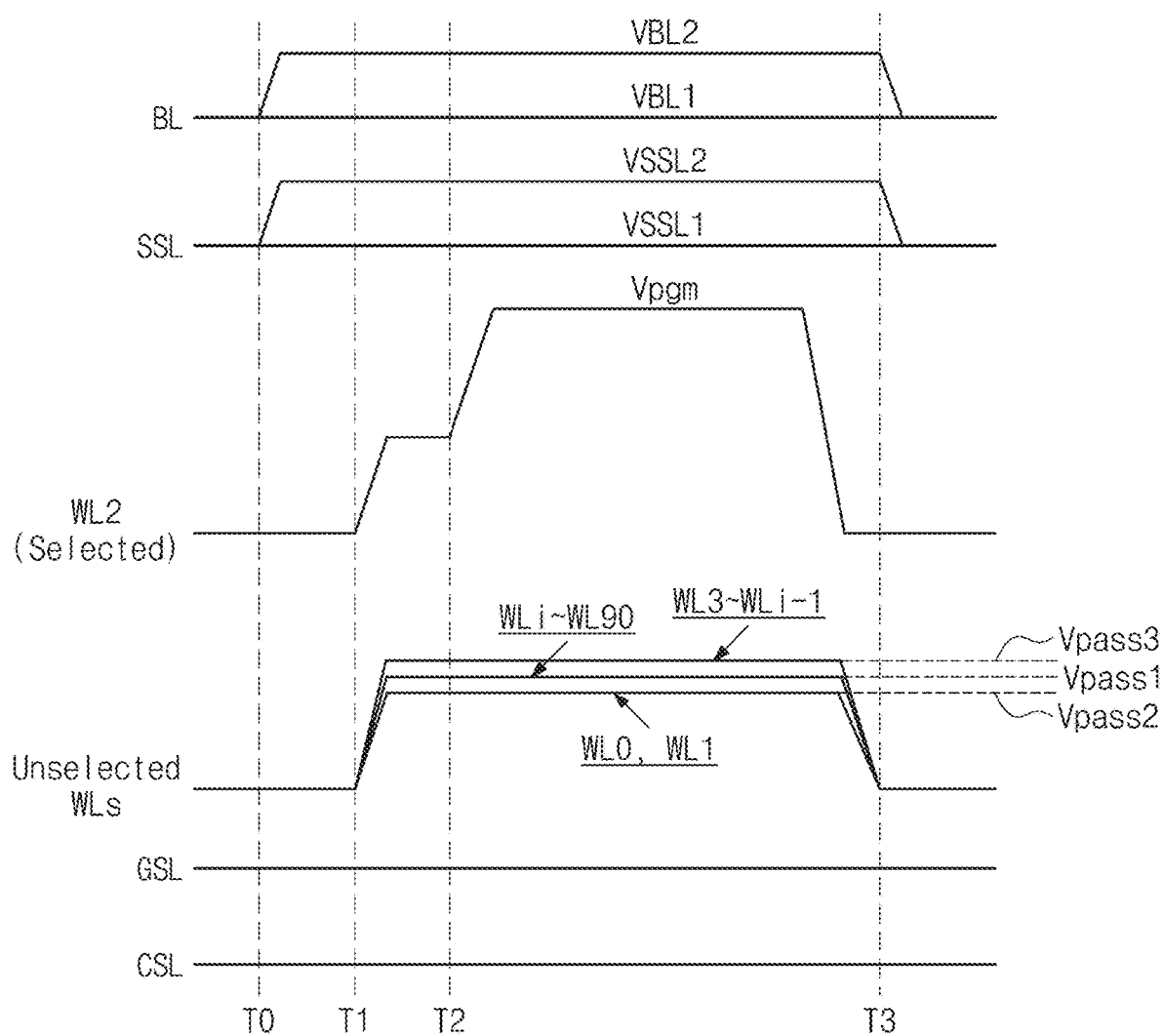
FIG. 12B is a waveform diagram illustrating word line voltages of a second pass condition, which are applied to word lines located above a reference word line in a program operation.

FIG. 12B is a waveform diagram illustrating word line voltages of a second pass condition, which may be applied to word lines located above the reference word line RWL in a program operation. Referring to FIG. 12B, when the word line WL2 is selected for the program operation, the selected word line WL2 may be much closer or closer to the substrate than the reference word line RWL. In this case, pass voltages that are applied in the program operation may be determined in compliance with the second pass condition.

A bit line voltage and a string selection voltage from the time T0 to the time T1 are the same as or similar to those of FIG. 12A, and thus, additional description will be omitted to avoid redundancy.

At the time T1, pass voltages Vpass1, Vpass2, and Vpass3 may be applied to word lines. Here, the third pass voltage Vpass3 higher than the first pass voltage Vpass1 may be applied to word lines WL3 to WLi−1 (i being a natural number: 4<i<90) of the second word line group located above the selected word line WL2. In addition, the first pass voltage Vpass1 lower than the third pass voltage Vpass3 may be applied to word lines WLi to WL90 of the third word line group located above the second word line group WL3 to WLi−1. The second pass voltage Vpass2 lower than the first pass voltage Vpass1 may be applied to the word lines WL0 to WL1 of the first word line group located below the selected word line WL2. In this case, one of the first, second, and/or third pass voltages Vpass1, Vpass2, and/or Vpass3 may be applied to the selected word line WL2.

Here, the number of word lines of the second word line group, to which the third pass voltage Vpass3 higher than the first pass voltage Vpass1 may be applied, may be selected appropriately in consideration of memory cell disturbance and hot electron injection (HCI). As the number of word lines of the second word line group increases, a potential of a first channel CH1 local-boosted may become higher, and thus, the probability of the hot electron injection (HCI) may become lower. However, the disturbance of memory cells due to the third pass voltage Vpass3 may increase as much as the increased potential of the channel. According to some example embodiments, the number of word lines included in the second word line group may vary depending on a sensed driving temperature of a non-volatile memory device (e.g., the non-volatile memory device 100). For example, the number of word lines included in the second word line group when the driving temperature is lower than a reference temperature may be more than the number of word lines included in the second word line group when the driving temperature is equal to or higher than the reference temperature.

At the time T2, the program voltage Vpgm may be applied to the selected word line WL2. There may be programmed memory cells of selected strings that may be connected to the selected word line WL2. The voltages of the second pass condition provided at the time T1 may be continuously supplied to the unselected word lines WL0, WL1, and WL3 to WL90. In this case, channels CH1 and CH2 of cell strings connected to the unselected string selection line may maintain a boosting state from the time T1 to the time T3. Accordingly, in the unselected cell strings, memory cells connected to the selected word line WL2 may be program inhibited.

At the time T3, the program voltage Vpgm and the pass voltages Vpass1, Vpass2, and Vpass3 supplied to the word lines may be recovered.

The word line voltages of the second pass condition, which may be applied to the word lines located above the reference word line RWL in the program operation, are described above.

Figure 13:
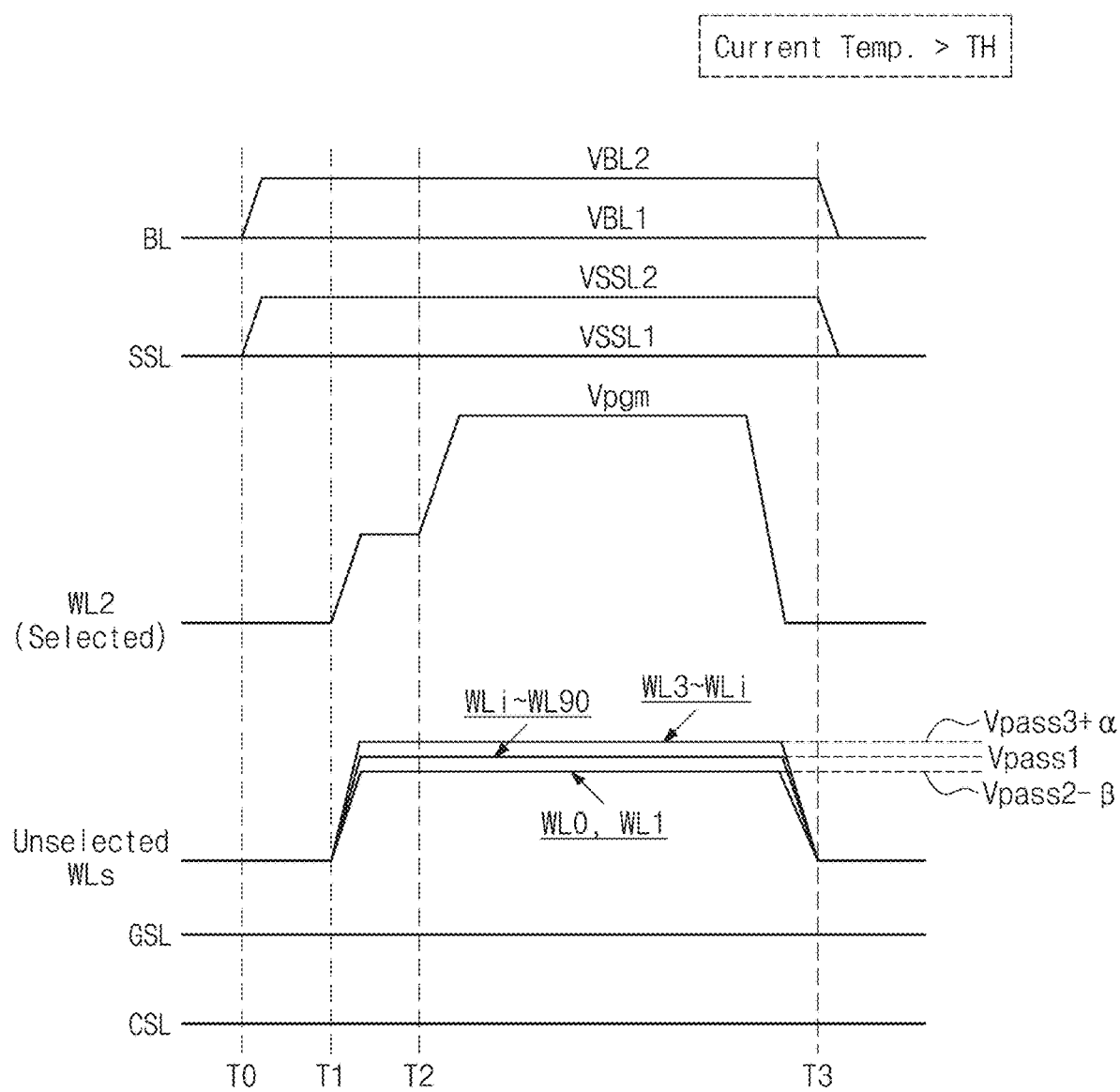
FIG. 13 is a waveform diagram illustrating word line voltages of a third pass condition that is applied when a driving temperature of a non-volatile memory device is lower than a reference temperature, compared with a second pass condition described with reference to FIG. 12.

FIG. 13 is a waveform diagram illustrating word line voltages of the third pass condition that may be applied when a driving temperature of a non-volatile memory device is lower than the reference temperature TH, compared with the second pass condition described with reference to FIG. 12. Referring to FIG. 13, when the word line WL2 is selected for the program operation, the selected word line WL2 is much closer or closer to the substrate than the reference word line RWL (e.g., WL15). When a current driving temperature included in the temperature information Temp_Info provided from the temperature sensor 170 (refer to FIG. 1) is the reference temperature TH or lower, the second pass condition described with reference to FIG. 12B may be applied to the program operation. However when it is determined that the current driving temperature is the reference temperature TH or higher, the third pass condition to be described below may be applied to the program operation.

A bit line voltage and a string selection voltage from the time T0 to the time T1 are the same as or similar to those of FIG. 12A, and thus, additional description will be omitted to avoid redundancy.

At the time T1, pass voltages Vpass1, Vpass2−β, and Vpass3+α may be applied to word lines. Here, the fifth pass voltage Vpass3+α higher than the third pass voltage Vpass3 may be applied to word lines WL3 to WLi−1 (i being a natural number: 4<i<90) of the second word line group located above the selected word line WL2. Here, α may be an offset that depends on a current temperature. The third pass voltage Vpass3 or the first pass voltage Vpass1 may be applied to word lines WLi to WL90 of the third word line group located above the selected word line WL2. The fourth pass voltage Vpass2−β lower than the second pass voltage Vpass2 may be applied to the word lines WL0 to WL1 of the first word line group located below the selected word line WL2. Here, β may be an offset that depends on a current temperature. In this case, one of the first, second, and/or third pass voltages Vpass1, Vpass2, and/or Vpass3 may be applied to the selected word line WL2.

At the time T2, the program voltage Vpgm may be applied to the selected word line WL2. Memory cells of selected strings, which are connected to the selected word line WL2, may be programmed. The voltages of the third pass condition provided at the time T1 may be continuously supplied to the unselected word lines WL0, WL1, and WL3 to WL90. In this case, channels CH1 and CH2 of cell strings connected to the unselected string selection line may maintain a boosting state from the time T1 to the time T3. Accordingly, in the unselected cell strings, memory cells connected to the selected word line WL2 may be program inhibited.

At the time T3, the program voltage Vpgm and the pass voltages Vpass1, Vpass2−β, and Vpass3+α supplied to the word lines may be recovered.

Word line voltages of the third pass condition that may be applied when it is determined that the current driving temperature is the reference temperature TH are described above.

Figure 14:
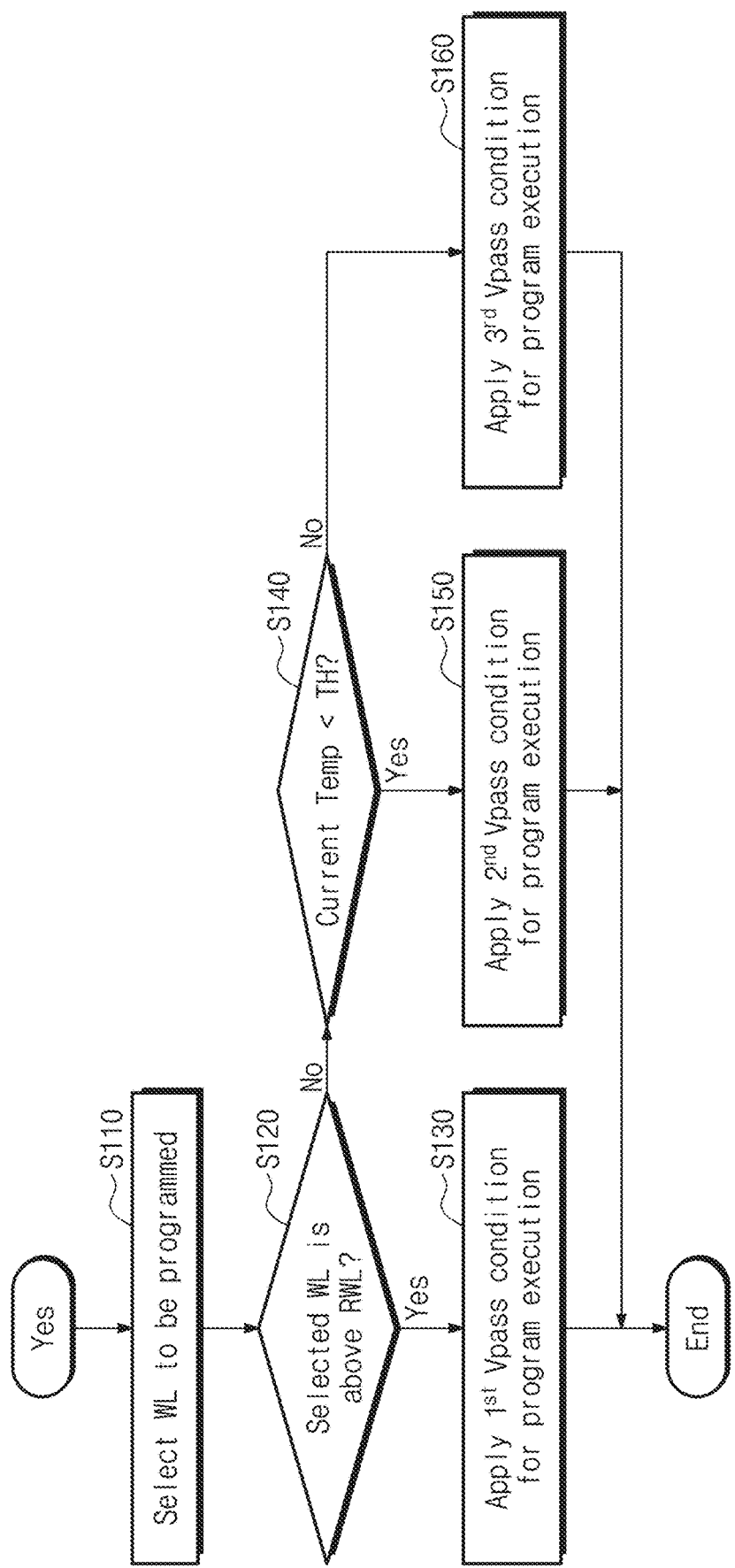
FIG. 14 is a flowchart illustrating a method of providing pass voltages in a program execution phase of some example embodiments, for each condition.

FIG. 14 is a flowchart illustrating a method of providing pass voltages in a program execution phase of some example embodiments, for each condition. Referring to FIGS. 1 and 14, optimum or improved pass voltage conditions may be selected depending on a location of a selected word line and/or a driving temperature in the program operation. Here, the order of selecting word lines of a cell string for the program operation is limited to the case where word lines distant from a substrate are first selected.

In operation S110, a word line WL to which the program voltage Vpgm will be applied may be selected by the control logic circuit 150 (refer to FIG. 1). The word line selected in operation S110 is referred to as a "selected word line". In some example embodiments, word lines distant from the substrate may be first selected to provide a program voltage thereto.

In operation S120, an operation branch may be made depending on a relative location of the selected word line with respect to the reference word line RWL by the control logic circuit 150. When (e.g., in response to determining) the selected word line is located above the reference word line RWL or is more distant from the substrate (Yes), the procedure may proceed to operation S130. When (e.g., in response to determining) the selected word line is located below the reference word line RWL or the selected word line is closer to the substrate than the reference word line RWL (No), the procedure may proceed to operation S140. For example, the reference word line RWL may be a word line WL15, which is the sixteenth word line from the substrate, from among the 91 word lines WL0 to WL90. However, it may be well understood that a location of the reference word line RWL may be variously determined depending on the number of layers of a three-dimensional semiconductor memory and/or a process characteristic.

In operation S130, the control logic circuit 150 may apply pass voltages to unselected word lines in compliance with the first pass condition. In this case, the program voltage Vpgm may be applied to the selected word line. Example levels of pass voltages of the first pass condition are illustrated in FIG. 12A. That is, the first pass voltage Vpass1 or the second pass voltage Vpass2 (Vpass2<Vpass1) may be applied to unselected word lines.

In operation S140, the control logic circuit 150 may obtain a current temperature, at which the non-volatile memory device 100 is driven, from the temperature information Temp_Info provided from the temperature sensor 170. The control logic circuit 150 may compare the current temperature with the reference temperature TH (e.g., may determine whether the current temperature is lower than the reference temperature TH) to make an operation branch for selecting a pass condition. When the current temperature is higher than or equal to the reference temperature TH (No), the procedure may proceed to operation S160. When the current temperature is lower than the reference temperature TH (Yes), the procedure may proceed to operation S150.

In operation S150, the control logic circuit 150 may determine that the driving temperature is not high enough to cause the hot electron injection (HCI) and may apply pass voltages to unselected word lines in compliance with the second pass condition. The program voltage Vpgm may be applied to the selected word line. Example levels of pass voltages of the second pass condition are illustrated in FIG. 12B. That is, the third pass voltage Vpass3 higher than the first pass voltage Vpass1 is applied to the second word line group including unselected word lines, which are located above the selected word line, from among the unselected word lines. The second pass voltage Vpass2 lower than the first pass voltage Vpass1 is applied to the first word line group including unselected word lines, which are located below the selected word line, from among the unselected word lines. In addition, the first pass voltage Vpass1 may be applied to the remaining unselected word lines (e.g., the third word line group) located above the second word line group.

In operation S160, the control logic circuit 150 may determine that the driving temperature is high enough to cause the hot electron injection (HCI) and may apply pass voltages to unselected word lines in compliance with the third pass condition. In this case, the program voltage Vpgm may be applied to the selected word line. Example levels of pass voltages of the third pass condition are illustrated in FIG. 13. That is, the pass voltage Vpass3+α higher than the third pass voltage Vpass3 is applied to the second word line group including unselected word lines, which are located above the selected word line, from among the unselected word lines. The pass voltage Vpass2−β lower than the second pass voltage Vpass2 is applied to the first word line group including unselected word lines, which are located below the selected word line, from among the unselected word lines. Also the first pass voltage Vpass1 may be applied to the remaining unselected word lines (e.g., the third word line group) located above the second word line group.

Procedures for providing optimum or improved pass voltages based on a location of a selected word line and/or a driving temperature in the program operation are described above.

Figure 15:
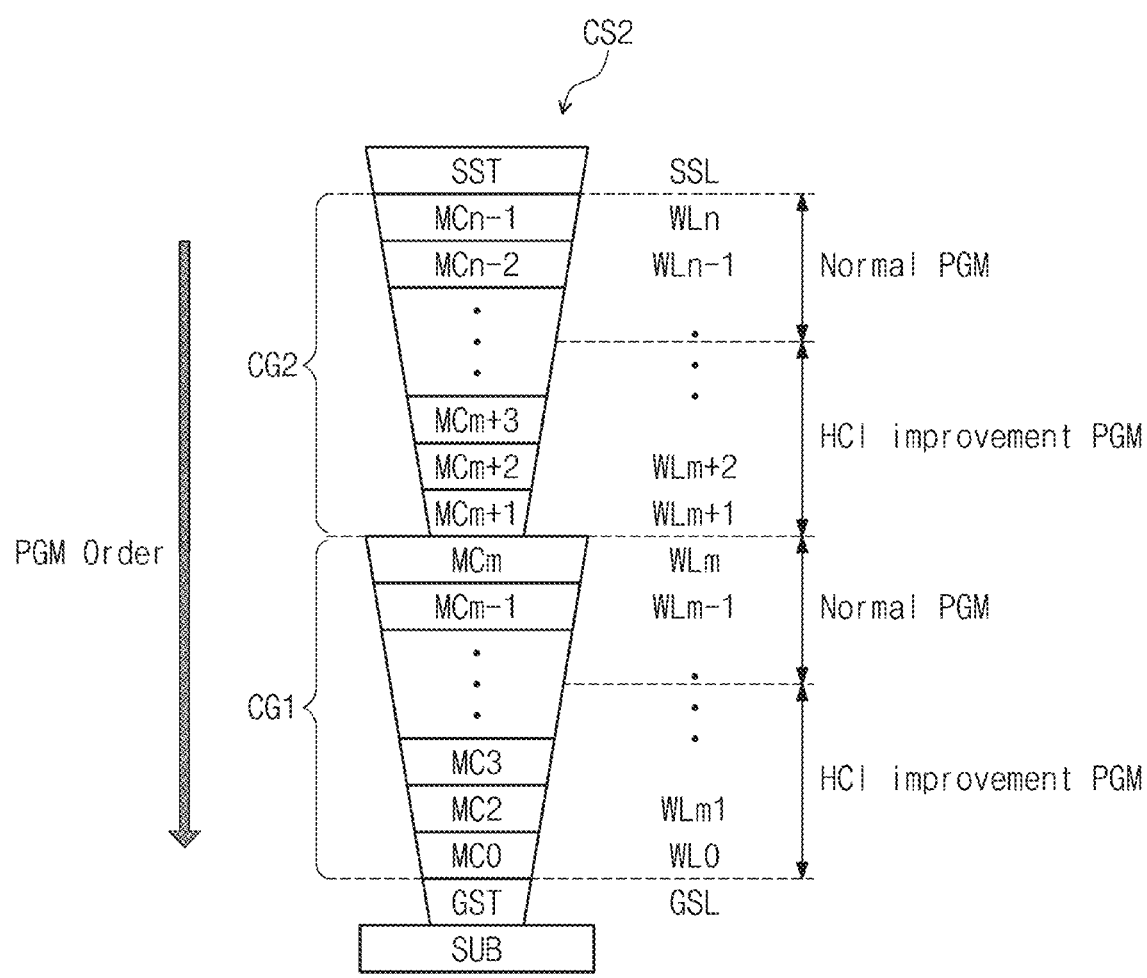
FIG. 15 is a diagram illustrating another example of a cell array structure to which a program method according to some example embodiments is applicable.

FIG. 15 is a diagram illustrating another example of a cell array structure to which a program method according to some example embodiments is applicable. Referring to FIG. 15, a cell string CS2 may include two cell groups CG1 and CG2 in each of which the size of a memory cell increases as a distance from the substrate SUB increases.

The first cell group CG1 may include memory cells MC0 to MCm, the sizes of which increase in order (e.g., the memory cell MC0, the memory cell MC2, the memory cell MC3, . . . , the memory cell MCm−1, and the memory cell MCm). The second cell group CG2 may include memory cells MCm+1 to MCn−1, the sizes of which increase in order (e.g., the memory cell MCm+1, the memory cell MCm+2, the memory cell MCm+3, . . . , the memory cell MCn−2, and the memory cell MCn−1). A program order may comply with an order where the memory cell MCn−1 most distant or distant from the substrate SUB is first programmed and the memory cell MC0 is lastly programmed. According to some example embodiments, any or all of the cell strings CS may be the same as or similar to the cell string CS2.

However, the cell string CS2 may be formed in the shape where a size of a channel hole uniformly decreases up to the center of the channel hole and again increases. Accordingly, the recovery operation RCV and the program execution operation PGM_EXE described with reference to FIG. 5 may be applied to a word line range where a size of a channel hole is a reference or smaller (e.g., a word line range selected from among the word lines WL0, WLm1, . . . , WLm−1, WLm, WLm+1, WLm+2, . . . , WLn−1, and WLn).

According to some example embodiments, a potential difference of localized channels may decrease in a program operation, thus preventing or reducing a decrease in reliability due to hot electron injection.

Spatially relative terms, such as "beneath," "below," "lower," "above," "upper" and the like, may be used herein for ease of description to describe one element or feature's relationship to another element(s) or feature(s) as illustrated in the figures. For example, as used herein, the terms "upper," "higher," "on," "over" and/or "top" may refer to an element or feature further in the perpendicular direction (as depicted in FIG. 2) with respect to another element or feature, and the terms "lower," "under" and/or "below" may refer to an element or feature further in a direction opposite the perpendicular direction with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "adjacent" to another element, it can be immediately adjacent or adjacent to the other element, or intervening elements may be present. As used herein the term "and/or" includes any and all combinations of one or more of the associated listed items.

Some example embodiments are described herein with reference to cross-sectional illustrations that are schematic illustrations of idealized examples. As such, variations from the shapes of the illustrations as a result, for example, of manufacturing techniques and/or tolerances, are to be expected. Thus, some example embodiments should not be construed as limited to the particular shapes of regions illustrated herein but are to include deviations in shapes that result, for example, from manufacturing.

Some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, contemporaneously, or in some cases be performed in reverse order.

While some example embodiments have been described, it will be apparent to those of ordinary skill in the art that various changes and modifications may be made thereto without departing from the spirit and scope of some example embodiments as set forth in the following claims.

What is claimed is:

1. A program method of a non-volatile memory device, the non-volatile memory device including a cell string in which a plurality of memory cells are stacked in a direction perpendicular to a surface of a substrate, the method comprising:
performing a first program phase including programming a first memory cell among the plurality of memory cells, the first memory cell being connected to a first word line among a plurality of word lines of the cell string, the first program phase including applying a first pass voltage to other word lines among the plurality of word lines above or below the first word line with respect to the substrate; and
performing a second program phase including programming a second memory cell among the plurality of memory cells after the first memory cell is completely programmed, the second memory cell being connected to a second word line among the plurality of word lines closer to the substrate than the first word line, the second program phase including applying a second pass voltage to a first word line group among the plurality of word lines below the second word line with respect to the substrate and applying a third pass voltage to a second word line group among the plurality of word lines above the second word line with respect to the substrate, the second pass voltage being lower than the third pass voltage, and
the method further comprises one of
increasing the third pass voltage based on a first offset depending on a driving temperature of the non-volatile memory device, or
decreasing the second pass voltage based on a second offset depending on the driving temperature.

2. The method of claim 1, wherein the second word line is closer to the substrate than a reference word line among the plurality of word lines.

3. The method of claim 1, wherein the second program phase includes applying a fourth pass voltage to a third word line group among the plurality of word lines above the second word line group with respect to the substrate, the fourth pass voltage being higher than the second pass voltage and lower than the third pass voltage.

4. The method of claim 1, further comprising:
sensing the driving temperature of the non-volatile memory device.

5. The method of claim 4, wherein
the method further comprises the increasing the third pass voltage; and
the increasing the third pass voltage increases the third pass voltage based on the first offset in response to the driving temperature being higher than a reference temperature.

6. The method of claim 4, wherein
the method further comprises the decreasing the second pass voltage; and
the decreasing the second pass voltage decreases the second pass voltage based on the second offset in response to the driving temperature being higher than a reference temperature.

7. The method of claim 1, wherein a channel hole of the first memory cell is larger than a channel hole of the second memory cell.

8. A non-volatile memory device comprising:
a memory cell array including a cell string in which a plurality of memory cells are stacked in a direction perpendicular to a surface of a substrate;
an address decoder configured to select a word line among a plurality of word lines included in the cell string for programming the plurality of memory cells;
a page buffer configured to control a bit line of the cell string; and
a control logic circuit configured to,
control the address decoder and the page buffer such that a word line among the plurality of word lines furthest from the substrate is first programmed in a program operation, and
perform a recovery phase after a program verify operation, the recovery phase including applying a recovery voltage to a selected word line among the plurality of word lines and unselected word lines among the plurality of word lines, and the recovery phase including applying a precharge voltage to a common source line of the cell string.

9. The non-volatile memory device of claim 8, wherein the control logic circuit is configured to:
perform a first program operation including programming a first memory cell among the plurality of memory cells connected to a first word line among the plurality of word lines, and the first program operation including applying a first pass voltage to other word lines among the plurality of word lines above or below the first word line with respect to the substrate; and
perform a second program operation including programming a second memory cell among the plurality of memory cells connected to a second word line among the plurality of word lines, and the second program operation including applying a second pass voltage a first word line group among the plurality of word lines below the second word line with respect to the substrate and applying a third pass voltage to a second word line group among the plurality of word lines above the second word line with respect to the substrate, the second word line being closer to the substrate than the first word line, the second pass voltage being less than the third pass voltage.

10. The non-volatile memory device of claim 8, further comprising:
a temperature sensor configured to measure a driving temperature and provide the measured driving temperature to the control logic circuit.

11. A program method of a non-volatile memory device, the non-volatile memory device including a cell string in which a plurality of memory cells are stacked in a direction perpendicular to a surface of a substrate, the method comprising:
performing a first program phase including programming a first memory cell among the plurality of memory cells, the first memory cell being connected to a first word line among a plurality of word lines of the cell string, the first program phase including applying a first pass voltage to other word lines among the plurality of word lines above or below the first word line with respect to the substrate; and
performing a second program phase including programming a second memory cell among the plurality of memory cells after the first memory cell is completely programmed, the second memory cell being connected to a second word line among the plurality of word lines closer to the substrate than the first word line, the second program phase including applying a second pass voltage to a first word line group among the plurality of word lines below the second word line with respect to the substrate and applying a third pass voltage to a second word line group among the plurality of word lines above the second word line with respect to the substrate, the second pass voltage being lower than the third pass voltage, the second pass voltage and the third pass voltage being determined based on whether the second word line is closer to the substrate than a reference word line, and
the method further comprises one of
    increasing the third pass voltage based on a first offset depending on a driving temperature of the non-volatile memory device, or
    decreasing the second pass voltage based on a second offset depending on the driving temperature.

\* \* \* \* \*